(12) United States Patent
Shin et al.

(10) Patent No.: US 12,114,452 B2
(45) Date of Patent: Oct. 8, 2024

(54) DISPLAY PANEL

(71) Applicant: LG Display Co., Ltd., Seoul (KR)

(72) Inventors: Myeongah Shin, Paju-si (KR); Junjae Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 171 days.

(21) Appl. No.: 17/988,618

(22) Filed: Nov. 16, 2022

(65) Prior Publication Data

US 2023/0199990 A1   Jun. 22, 2023

(30) Foreign Application Priority Data

Dec. 22, 2021   (KR) .................... 10-2021-0184905

(51) Int. Cl.
*H05K 7/20* (2006.01)
*H05K 5/03* (2006.01)

(52) U.S. Cl.
CPC ........... *H05K 5/03* (2013.01); *H05K 7/20963* (2013.01)

(58) Field of Classification Search
CPC .............................. H05K 5/03; H05K 7/20963
See application file for complete search history.

(56) References Cited

U.S. PATENT DOCUMENTS

| | | | | |
|---|---|---|---|---|
| 2008/0204619 A1* | 8/2008 | Saitou | ............... | G02F 1/136204 |
| | | | | 257/E27.009 |
| 2013/0335660 A1* | 12/2013 | Jung | .................... | G02F 1/13452 |
| | | | | 438/30 |
| 2016/0278201 A1* | 9/2016 | Cheon | ............... | G02F 1/133308 |
| 2016/0283028 A1* | 9/2016 | Yamazaki | ........... | G02F 1/13306 |
| 2018/0149785 A1* | 5/2018 | Lee | .................... | G02F 1/133305 |
| 2021/0175471 A1* | 6/2021 | Kim | .................... | H10K 50/8445 |

FOREIGN PATENT DOCUMENTS

| | | | | |
|---|---|---|---|---|
| JP | 2021072131 A | * | 5/2021 | ......... G02F 1/13338 |
| KR | 10-2021-0030145 A | | 3/2021 | |

OTHER PUBLICATIONS

JP 2021072131 A Nakamura Machine Translation.*

* cited by examiner

*Primary Examiner* — Jacob R Crum
(74) *Attorney, Agent, or Firm* — Birch, Stewart, Kolasch & Birch, LLP

(57) ABSTRACT

A display panel can prevent a Greenish phenomenon by preventing a shift phenomenon of a transistor inside a display layer, by applying a permittivity reduction processing on a component disposed upon a panel layer. The display panel can include a cover window, an adhesive layer disposed below the cover window, a polarizer disposed below the adhesive layer, and the panel layer disposed below the polarizer. Further, at least one among the cover window, the adhesive layer and the polarizer can be applied with a permittivity reduction processing.

17 Claims, 14 Drawing Sheets

DISPLAY PANEL

CROSS REFERENCE TO RELATED APPLICATION

The present application claims priority to Korean Patent Application No. 10-2021-0184905, filed on Dec. 22, 2021 in the Republic of Korea, the entire contents of which are incorporated by reference into the present application.

BACKGROUND

Field

The present disclosure relates to a display panel and particularly to a display panel capable of preventing a Greenish phenomenon by preventing a shift phenomenon of a transistor inside a display layer, by applying a permittivity reduction processing on a component disposed upon a panel layer.

Description of the Related Art

As examples of a display device, a liquid crystal display (LCD), a field emission display device (FED), an electrowetting display device (EWD) and an organic light emitting display device (OLED) are used.

Such a display device can include a cover window made of a glass or plastic material so as to protect a display panel from external shocks. However, there can be a limitation in that an electric charge generated by friction between the cover window and an external object or generated from the outside can pile up in the cover window. In addition, the electric charge can transfer from a side of the display panel to a panel layer inside the display panel, and such can cause a shift phenomenon which shifts a threshold voltage of a driving thin film transistor mounted inside a display layer.

If the threshold voltage of the driving thin film transistor is shifted higher by the shift phenomenon, the display panel can emit light by a voltage higher than before, and a Greenish phenomenon where an end or a side area of the display panel emits light brighter than other area can occur, which can cause a deteriorated image quality.

In the alternative, if the threshold voltage of the driving thin film transistor is decreased by the shift phenomenon, the display panel can emit light by a signal lower than an emission signal, and that can cause a Greenish phenomenon causing to emit a brighter light than other area, which can lead to a deteriorated image quality.

SUMMARY OF THE DISCLOSURE

One or more purposes of the present disclosure are to prevent such a limitation associated with a Greenish phenomenon by preventing the shift phenomenon of a transistor inside the panel layer.

One embodiment of the present disclosure is to provide a display panel including: a cover window; an adhesive layer disposed below the cover window; a polarizer disposed below the adhesive layer; and a panel layer disposed below the polarizer, and at least one among the cover window, the adhesive layer and the polarizer is applied with a permittivity reduction processing.

At least one among the cover window, the adhesive layer and the polarizer on (or onto) which the permittivity reduction processing is applied can be characterized in forming an electric field with an electric charge penetrated from the cover window into the panel layer.

A permittivity of the adhesive layer can be lower than a permittivity of the cover window.

The adhesive layer can be formed of a material having a permittivity of 2.6 or less.

The adhesive layer can include a low permittivity filler.

The cover window can further include a low permittivity coating layer disposed below the cover window.

The polarizer can further include a low permittivity coating layer disposed on the polarizer.

The polarizer can further include a low permittivity coating layer disposed below the polarizer.

In one embodiment of the present disclosure, the display panel can include a pad area where pads are formed. At a pad edge where the pad area is in contact with, the display panel can further include a circuit element and a driver IC disposed below the panel layer; and an adhesive, a cushion tape and a heat dissipation sheet sequentially disposed below the panel layer.

The display panel can include a pad area where pads are formed, and at a peripheral edge where the pad area is not in contact with, the display panel can further include an adhesive and a cushion tape sequentially disposed below the panel layer, and the cushion tape can be directly attached to a middle frame.

According to the present disclosure, a Greenish phenomenon can be prevented by preventing a shift phenomenon of a transistor and decreasing an intensity of an electric charge penetrated into the inside of a panel and an electric field generated inside the panel, by applying a permittivity reduction processing over at least one among a cover window, an adhesive layer and a polarizer disposed upon a panel layer.

Unlike related art with which application of a conductive solution in an edge area where a pad is located cam be difficult, according to the present disclosure it is possible to prevent a shift phenomenon and a Greenish phenomenon which can occur in an edge area.

According to the present disclosure, it is possible to remove a heat dissipation sheet locally in a peripheral area where a pad is not located.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
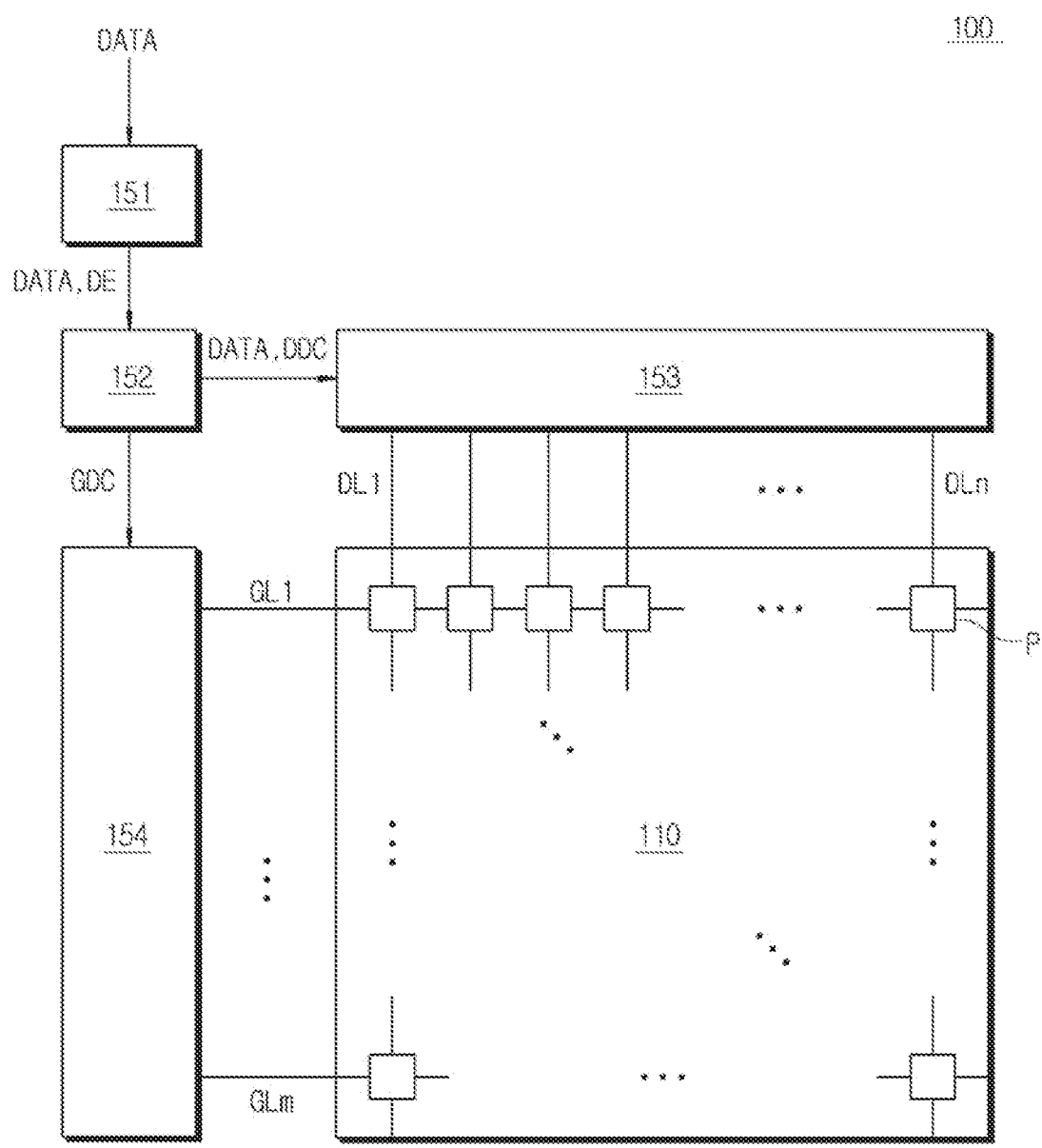
FIG. 1 is a block diagram of a display panel according to an embodiment of the present disclosure.

Hereinafter, the embodiments will be described with reference to the accompanying drawings. When an element (or an area, a layer, a part and the like) is 'on' another element, is 'connected' with, or is 'coupled' to another element, the element can be directly connected with or coupled to another element or a third intervening element (or additional elements) can be disposed therebetween.

Like reference numerals of the accompanying drawings denote like elements. In addition, thicknesses, ratios and dimensions of the elements in the accompanying drawings are exaggerated for convenience of describing the specification. The term "and/or" includes any and all combinations of one or more of the associated listed items.

Though terms such as 'a first', or 'a second' are used to describe various components, these components are not confined by these terms. These terms are merely used to distinguish one component from the other component, and may not define any order. For example, without departing from the scope of the rights of various embodiments of the present invention, a first component can be referred to as a second component, and similarly, a second component can be referred to as a first component. The singular forms expressed herein are intended to include the plural forms as well, unless the context expressly indicates otherwise.

Terms such as 'below', 'at a lower portion', 'on', 'at an upper portion' and the like are used to describe position relation of parts illustrated in the accompanying drawings. Such terms are of relative concept and are explained based on the directions marked in the drawings.

It should be understood that terms such as 'comprise', or 'have' and the like are used only to designate that there are features, numbers, steps, operations, components, parts or combination thereof, however such terms do not preclude existence or addition of one or more another features, numbers, steps, operations, components, parts or combination thereof.

Also, the present disclosure decided to explain an organic light emitting display panel as an example for convenience of description. However, the concept of the present disclosure is not confined by the organic light emitting display panel, and can be applied in the same or similar way to other types of display panels such as a liquid crystal display panel, a mini-LED display panel and the like. Further, the present disclosure provides a display apparatus/device that includes the display panel discussed herein and any other applicable components/elements associated with the display panel. In addition, all the components of each display panel and each display apparatus according to all embodiments of the present disclosure are operatively coupled and configured.

FIG. 1 is a block diagram of a display panel (or display apparatus) according to an embodiment of the present disclosure.

Referring to FIG. 1, a display panel 100 can include an image processor 151, a timing controller 152, a data driver 153, a gate driver 154 and a panel layer 110.

The image processor 151 can output a data enable signal (DE) and a data signal (DATA) being supplied from the outside. Apart from the data enable signal (DE), the image processor 151 can output one or more signals among a vertical synchronizing signal, a horizontal synchronizing signal and a clock signal.

The timing controller 152 is supplied with the data signal (DATA), and a driving signal that includes the data enable signal (DE), a vertical synchronizing signal, a horizontal synchronizing signal and a clock signal from the image processor 151. The timing controller 152 can output a gate timing control signal (GDC) for controlling an operation timing of a gate driver 154, and a data timing control signal (DDC) for controlling an operation timing of a data driver 153.

In response to the data timing control signal (DDC) supplied from the timing controller 152, the data driver 153 can convert the data signal (DATA) into gamma reference voltages through sampling and latching and output it thereafter. The data driver 153 can output the data signal (DATA) through data lines (DL1~DLn).

The gate driver 154 can output a gate signal while shifting a level of a gate voltage in response to the gate timing control signal (GDC) supplied by the timing controller 152. The gate driver 154 can output the gate signal through gate lines (GL1~GLm).

The panel layer 110 can display an image as sub-pixels (P) emit light by responding to the data signal (DATA) and the gate signal supplied by the data driver 153 and the gate driver 154. Detailed structure of a sub-pixel (P) will be described with reference to FIGS. 2 to 5.

Figure 2:
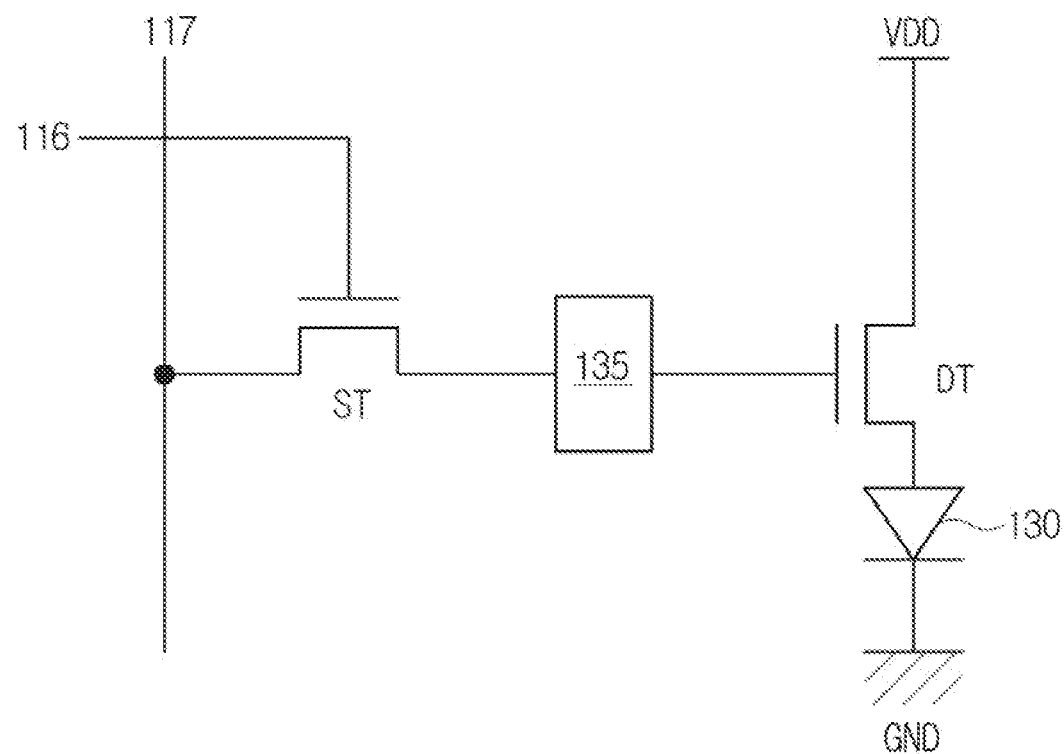
FIG. 2 is a circuit diagram of a sub-pixel included in the display panel according to an embodiment of the present disclosure.

FIG. 2 is a circuit diagram of a sub-pixel included in the display panel according to an embodiment of the present disclosure.

Referring to FIG. 2, each of one or more sub-pixels of the display panel 100 can include a switching transistor (ST), a driving transistor (DT), a compensation circuit 135 and a light emitting element 130.

The light emitting element 130 can operate to emit light by a driving current formed by the driving transistor (DT).

The switching transistor (ST) can operate switching so that the data signal supplied through a data line 117 as a response to the gate signal provided through a gate line 116 can be saved as a data voltage in a capacitor.

The driving transistor (DT) can operate to flow a regular driving current between a high potential power line (VDD) and a low potential power line (GND), by corresponding to a data voltage stored in the capacitor.

The compensation circuit 135 compensates a threshold voltage of the driving transistor (DT) and the like, and the compensation circuit 135 can include one or more thin film transistors and capacitors. Configuration of the compensation circuit 135 can vary greatly depending on manners of compensation. For example, a sub-pixel in FIG. 2 is configured as 2T1C (two transistors and one capacitor) structure which includes a switching transistor (ST), a driving transistor (DT), a capacitor and a light emitting element 130.

However, if a compensation circuit 135 is added thereto, the sub-pixel can be configured variously such as 3T1C, 4T2C, 5T2C, 6T1C, 6T2C, 7T1C, 7T2C and the like.

Figure 3:
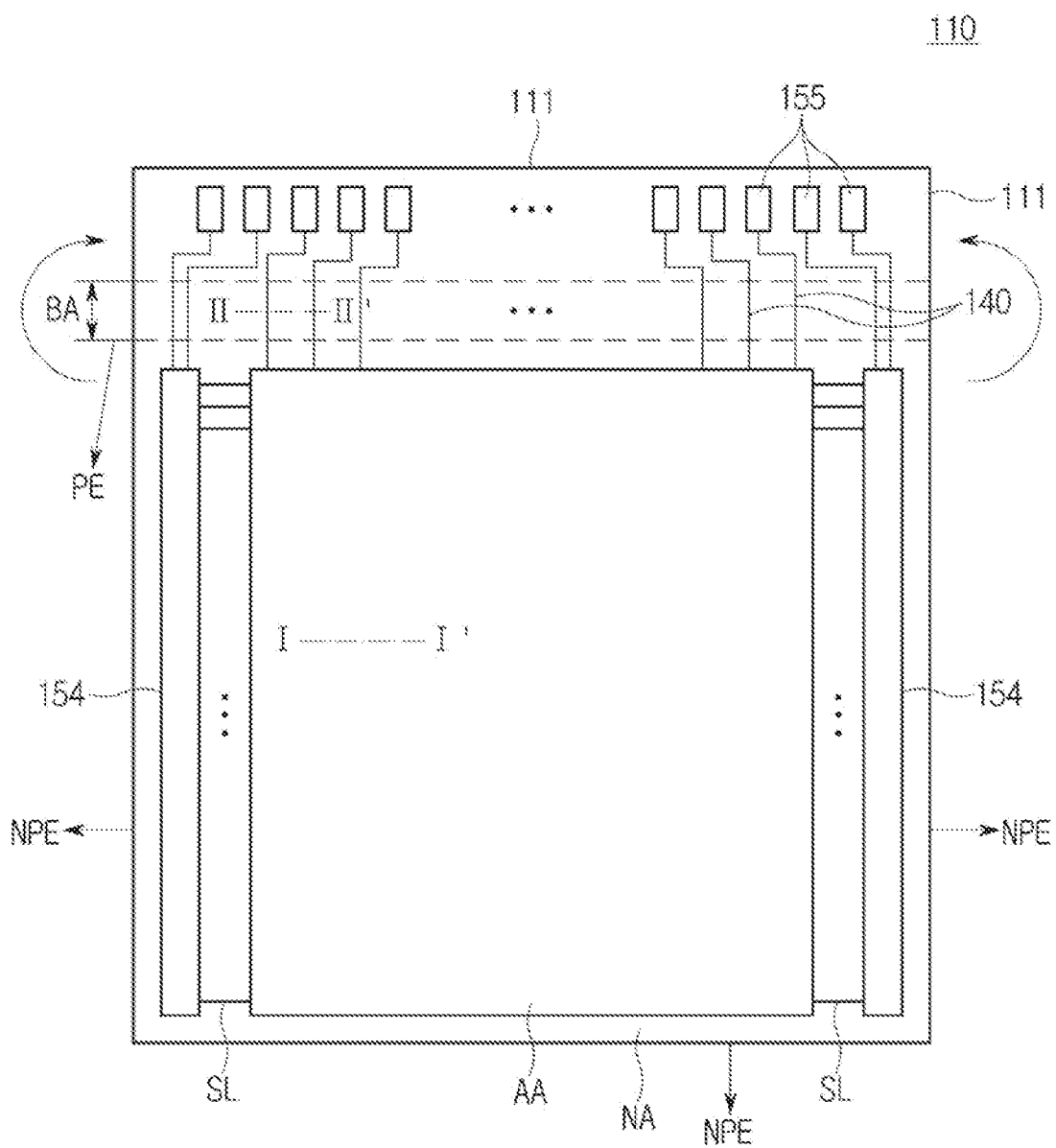
FIG. 3 is a plan view of a display panel according to an embodiment of the present disclosure.

FIG. 3 is a plan view of a display panel according to an embodiment of the present disclosure, and shows an example of a state where a panel layer of the display panel 100 is not bent.

Referring to FIG. 3, the panel layer 110 can include an active area (AA) where pixels emitting light through a thin film transistor and a light emitting element are disposed upon a flexible substrate 111, and a non-active area (NA) that is the bezel area surrounding edges of the active area (AA).

In the non-active area (NA) of the flexible substrate 111, a circuit such as a gate driving unit 154 to drive the panel layer 110 and the like and wirings of various signals such as a scan line (SL) and the like can be disposed.

A circuit to drive the panel layer 110 can be disposed upon the flexible substrate 111 in Gate in Panel (GIP) manner or be connected to the flexible substrate 111 in Tape Carrier Package (TCP) or Chip on Film (COF) manner.

Based on FIG. 3, a pad 155 of metal pattern can be disposed on an upper side among four sides of the flexible substrate 111. The pad 155 is a metal pattern to be bonded with an external module. In the present disclosure, out of four sides shown in a state after the flexible substrate 111 is bent, a side on which pads are formed is referred to as a pad edge (PE). In other words, based on FIG. 3, a virtual line from which the bending starts in the bending area (BA) can be defined as a pad edge (PE). In addition, out of four sides of the flexible substrate 111, the remaining sides where the pads are not formed is referred to as peripheral edges (NPE) in the present disclosure. Based on FIG. 3, the peripheral region can be a left side, a right side and a lower side. Definition of the pad edge (PE) and the peripheral edge (NPE) will be provided in detail later on with reference to FIG. 8.

A bending area (BA) can be formed on a side of the non-active area (NA). The bending area (BA) can refer to an area of the flexible substrate 111 that is configured to be bent in an arrow direction.

In the non-active area (NA) of the flexible substrate 111, wirings and a driving circuit in order to drive a screen are disposed. Since an image is not displayed in the non-active area (NA), the non-active area (NA) does not need to be acknowledged from a front surface of the flexible substrate 111. Therefore, an area to position the wirings and the driving circuit can be secured while at the same time reducing the bezel, by bending some area of the non-active area (NA) of the flexible substrate 111.

Various wirings can be formed upon the flexible substrate 111. The wiring can be formed in the active area (AA) or in the non-active area (NA) of the flexible substrate 111. The wiring of circuits 140 is formed of a conductive material, and can be formed of a conductive material with excellent flexibility in order to reduce a crack that is likely to occur when the flexible substrate 111 is bent. The wiring of circuits 140 can be formed of conductive materials having excellent flexibility such as gold (Au), silver (Ag), aluminum (Al) and the Or, the wiring of circuits 140 can be formed of alloys of magnesium (Mg) and silver (Ag), molybdenum (Mo), chrome (Cr), titanium (Ti), nickel (Ni), neodymium (Nd) and copper (Cu). The wiring of circuits 140 can be formed in a multi-layer structure that includes various conductive materials, and for example, can be formed in a three-layer structure consisting of titanium (Ti), aluminum (Al) and titanium (Ti).

The wiring of circuits 140 formed in the bending area (BA) gets tensile force when being bent. The wiring of circuits 140 that extends in a direction that is the same as a bending direction in the flexible substrate 111 gets the biggest tensile force. Therefore, some of the wiring of circuits 140 disposed in the bending area (BA) can be formed to extend in a diagonal direction which differs from the bending direction.

Figure 4:
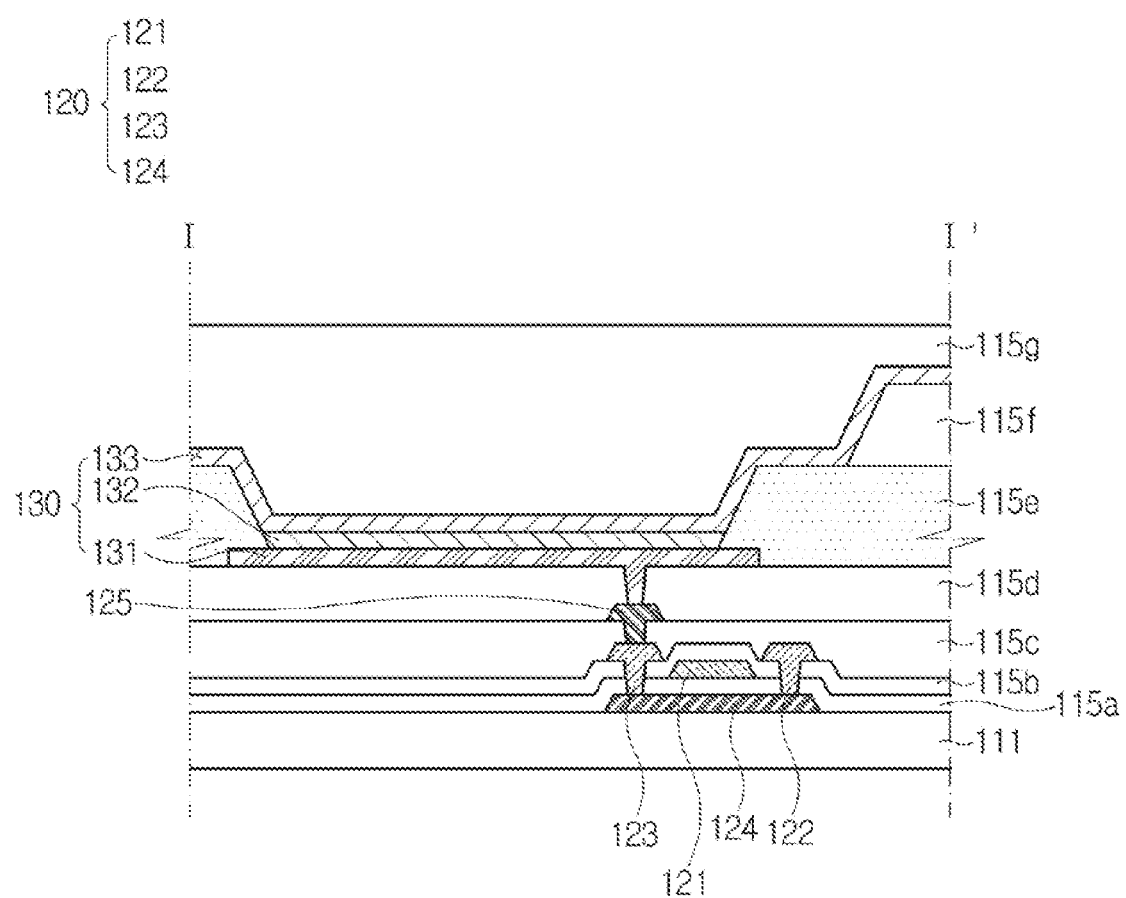
FIG. 4 is a sectional view of a panel layer taken along I-I' of FIG. 3.

FIG. 4 is a sectional view of a panel layer taken along I-I' of FIG. 3.

Figure 5:
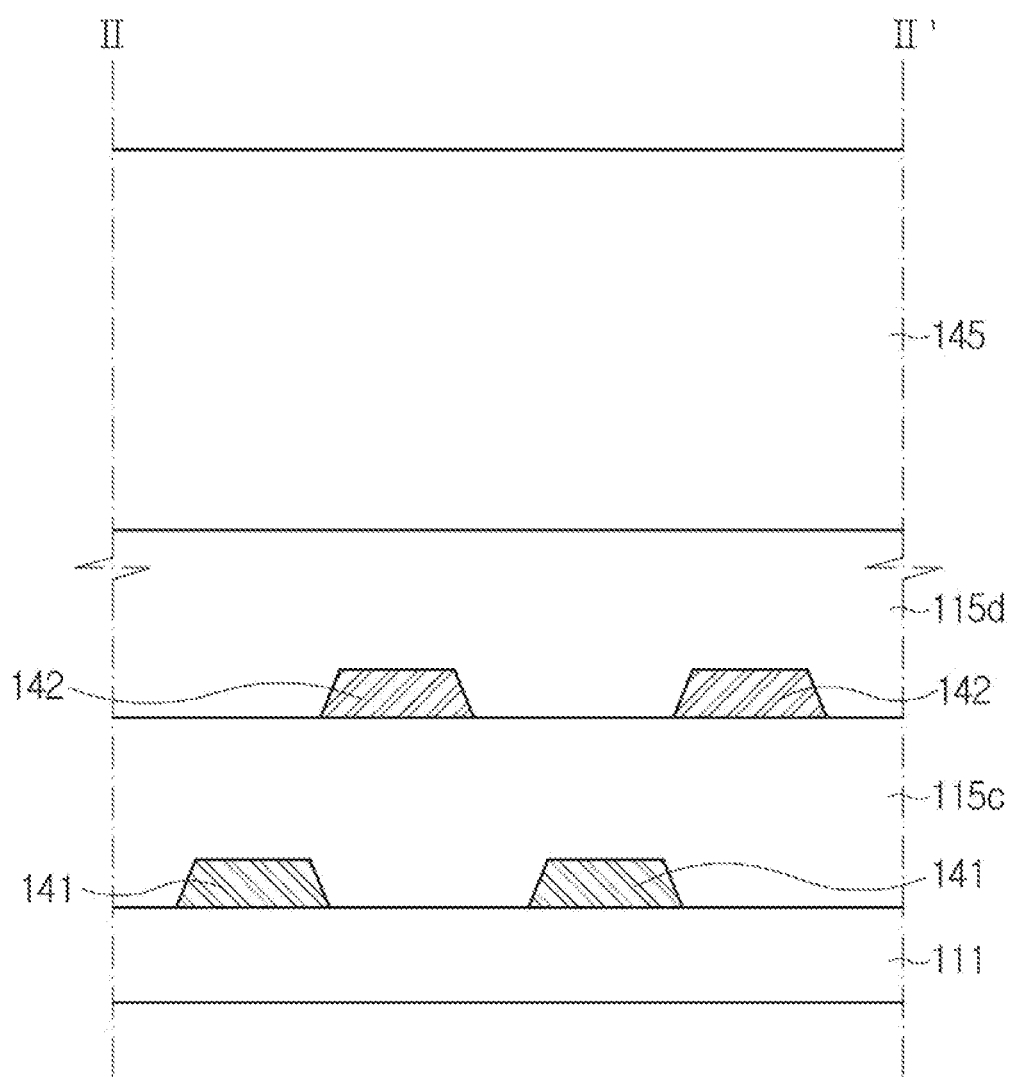
FIG. 5 is a sectional view of the panel layer taken along II-IF of FIG. 3.

FIG. 5 is a sectional view of the panel layer taken along II-IF of FIG. 3.

The panel layer 110 according to the present disclosure will be described by referring to FIG. 4 and FIG. 5.

Referring to FIG. 4, the flexible substrate 111 is a plate-shaped configuration disposed at the bottom, and serves to support and protect other components disposed upon the flexible substrate 111. The flexible substrate 111 can be formed of glass or plastic. For example, the flexible substrate 111 can be formed of a film including one of the groups consisting of a polyester polymer, a silicone polymer, an acrylic polymer, a polyolefin polymer, and a copolymer thereof.

A buffer layer can be further disposed in the flexible substrate 111. The buffer layer prevents penetration of moisture or foreign substance from the outside into the flexible substrate 111, and can flatten a surface of the flexible substrate 111. The buffer layer is not a necessary configuration, and can be omitted depending on a kind of thin film transistor 120 disposed in the flexible substrate 111.

The thin film transistor 120 is disposed in the flexible substrate 111 and can include a gate electrode 121, a source electrode 122, a drain electrode 123 and a semiconductor layer 124. The semiconductor layer 124 can be formed of amorphous silicon or polycrystalline silicon. The semiconductor layer 124 can be formed of an oxide semiconductor. The semiconductor layer 124 can include a drain region, a source region including p-type or n-type impurities and a channel region existing between the source region and the drain region. In addition, the semiconductor layer 124 can further include a lightly-doped region in the source region or the drain region located adjacent to the channel region.

The source region or the drain region are heavily doped with impurities and the source electrode 122 and the drain electrode 123 of the thin film transistor 120 can be connected thereto respectively.

Depending on a structure of the thin film transistor of NMOS or PMOS, the channel region of the semiconductor layer 124 can be doped with n-type or p-type impurities.

A first insulation layer 115a can be formed in a single layer or multi-layer structure that consists of silicon oxide (SiOx) or silicon nitride (SiNx). The first insulation layer 115a can be disposed so that a current flowing through the semiconductor layer 124 does not flow to the gate electrode 121.

The gate electrode 121 can serve as a switch for turning on or off the thin film transistor 120 based on an electric signal transmitted from the outside through the gate line. The source electrode 122 and the drain electrode 123 are connected to the data line, and can allow an electric signal transmitted from the outside to be transmitted from the thin film transistor 120 to the light emitting element 130.

A second insulation layer 115b can be formed on the first insulation layer 115a and the gate electrode 121. The second insulation layer 115b can be formed of a single layer or multiple layers of silicon oxide or silicon nitride to insulate the gate electrode 121, the source electrode 122 and the drain electrode 123 with each other.

A first planarization layer 115c and a second planarization layer 115d can be disposed on the second insulation layer 115b. The first planarization layer 115c and the second planarization layer 115d can be configurations to protect the thin film transistor 120 and flatten out steps formed by the thin film transistor 120. The first planarization layer 115c and the second planarization layer 115d can be formed of one or more materials among acrylic resin, epoxy resin, phenol resin, polyamide resin, unsaturated polyester resin, poly-phenylene resin, poly-phenylene sulfide resin, and benzocyclobutene.

An intermediate electrode 125 can be connected to the thin film transistor 120 through a contact hole formed in the first planarization layer 115c. The intermediate electrode 125 can electrically connect an anode electrode 131 to the drain electrode 123 of the thin film transistor 120.

The light emitting element 130 can be disposed on the second planarization layer 115d. The light emitting element 130 can include the anode electrode 131, a light-emitting portion 132 and a cathode electrode 133.

The anode electrode 131 is disposed on the second planarization layer 115d, and can serve to supply holes to the light-emitting portion 132. The anode electrode 131 can contact with the intermediate electrode 125 through a contact hole formed to penetrate the second planarization layer 115d. The anode electrode 131 can be formed of indium zinc oxide, indium tin oxide and the like which are transparent conductive materials.

A bank 115e can be disposed on the anode electrode 131 and the second planarization layer 115d. The bank 115e can define sub-pixels by dividing areas that actually emit light. A spacer 115f can be disposed on the bank 115e so as to prevent damage arising upon contacting with a deposition mask.

The light-emitting portion 132 can be disposed on the anode electrode 131. The light-emitting portion 132 can serve to emit light. The light-emitting portion 132 can include organic light emitting materials that emit light by themselves by an electric signal. The light-emitting portion 132 can include organic light emitting materials that emit light with colors, for example, red, green, blue, white and the like.

The cathode electrode 133 can be disposed on the light-emitting portion 132. The cathode electrode 133 can serve to supply an electron to the light-emitting portion 132. The cathode electrode 133 can be formed of a metal material such as magnesium (Mg), an alloy of silver and magnesium and the like. In addition, the cathode electrode 133 can be formed of transparent conductive oxides such as series of tin oxide, indium zinc oxide, indium tin oxide, indium zinc tin oxide, zinc oxide and the like.

An encapsulation layer 115g can be disposed on the cathode electrode 133. The encapsulation layer 115g can serve to prevent damage arising out of oxidization of components disposed below after penetration of moisture, oxygen, or a foreign material introduced from the outside into the components. The encapsulation layer 115g can be formed by laminating a plurality of barrier films. The encapsulation layer 115g can be formed of aluminum oxide or silicon nitride which are inorganic substances.

In describing FIG. 5, descriptions that are redundant with what are mentioned above will be omitted or may be briefly discussed.

Referring to FIG. 5, the display panel 100 according to the present disclosure can include a first wiring 141 and a second wiring 142 configured in a double-layer in the non-active area (NA) that includes the bending area (BA).

Specifically, in the flexible substrate 111, the first wiring 141 can be formed. On the first wiring 141, the first planarization layer 115c can be formed. In the first planarization layer 115c, the second wiring 142 can be formed. On the second wiring 142, the second planarization layer 115d can be formed. On the second planarization layer 115d, a micro-coating layer 145 can be formed.

The first wiring 141 and the second wiring 142 are aimed at connecting the panel layer 110 and the pad area (PA). The first wiring 141 and the second wiring 142 can be formed of conductive materials having excellent flexibility such as silver, gold, aluminum and the like. Or, the first wiring 141 and the second wiring 142 can be formed of alloys of molybdenum, chrome, titanium, nickel, neodymium, copper, silver and the like.

While the flexible substrate 111 is being bent, a huge stress is given to the bending area (BA). A crack can occur in layers that wrap wirings due to such stress. Also, a large space to arrange wirings is required when forming wirings in a single layer. As in the present disclosure, by configuring wirings passing the bending area (BA) to be formed in a multiple-layer structure, it is possible to reduce stress occurring in layers wrapping the wirings and decrease a space required to arrange the wirings.

Figure 6:
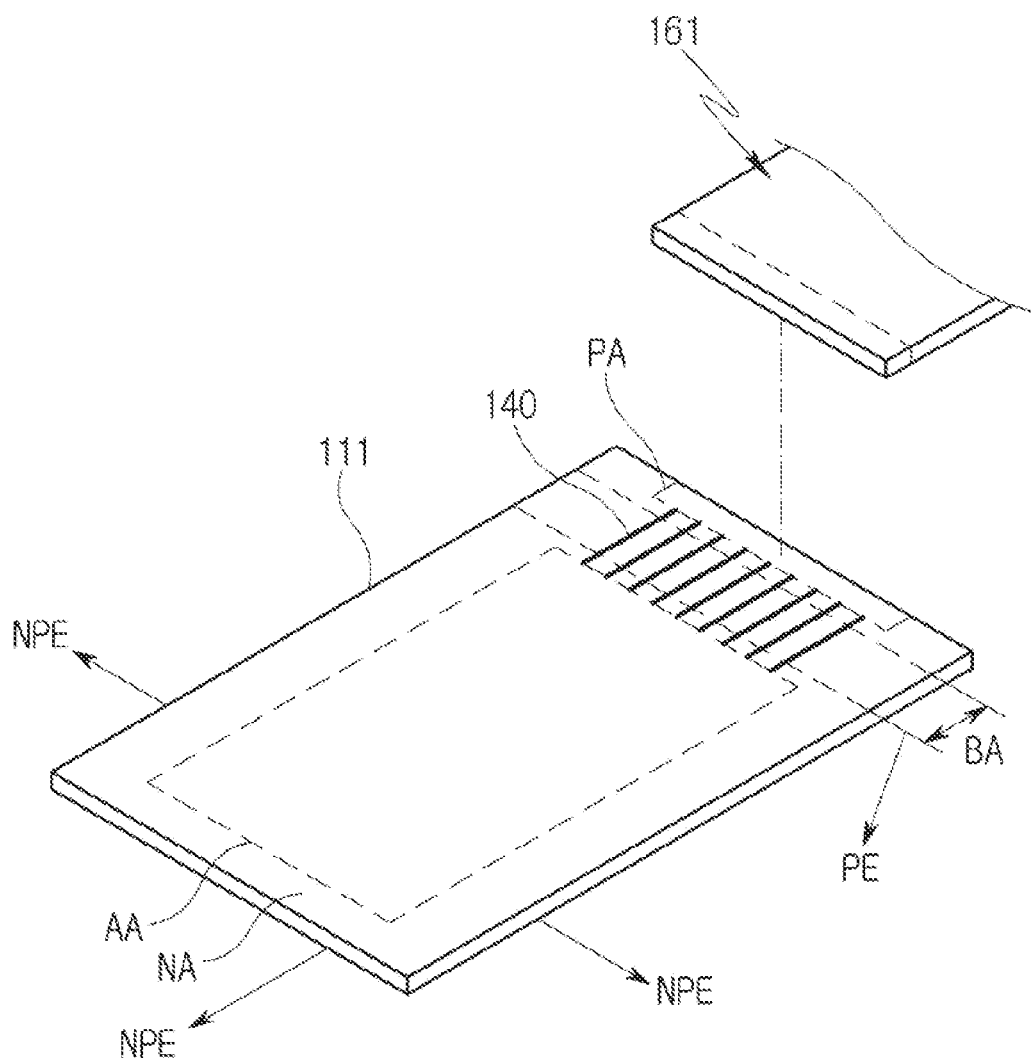
FIG. 6 is a perspective view of a flexible panel according to an embodiment of the present disclosure.

FIG. 6 is a perspective view of a flexible panel according to an embodiment of the present disclosure.

Figure 7:
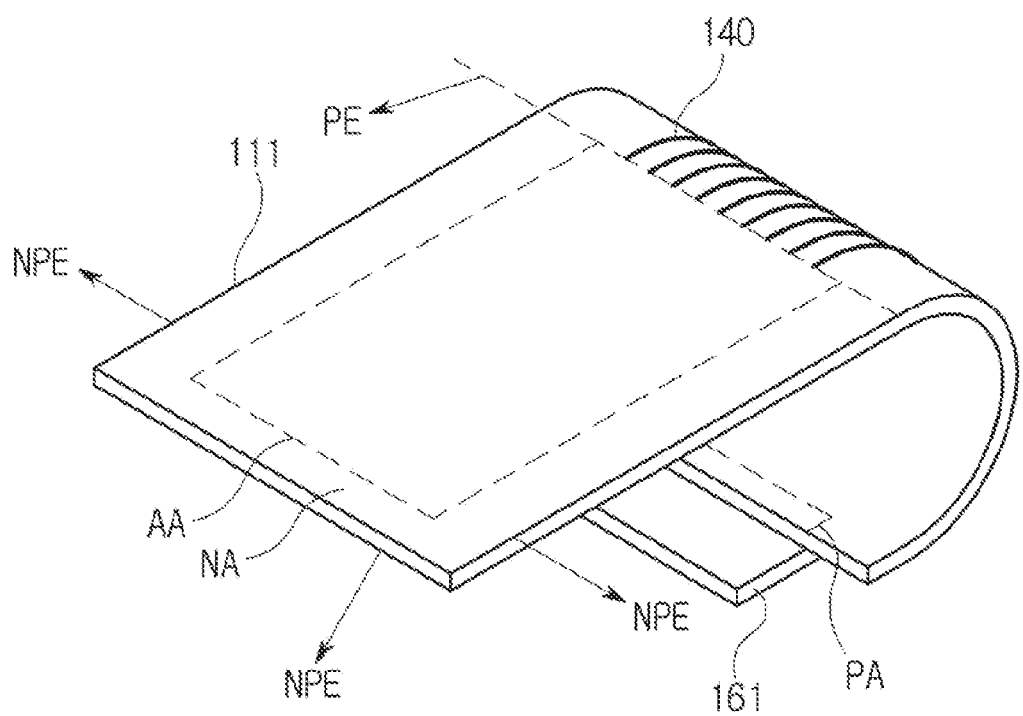
FIG. 7 is a perspective view that shows a bending status of a flexible panel according to an embodiment of the present disclosure.

FIG. 7 is a perspective view that shows a bending status of a flexible panel according to an embodiment of the present disclosure.

Figure 8:
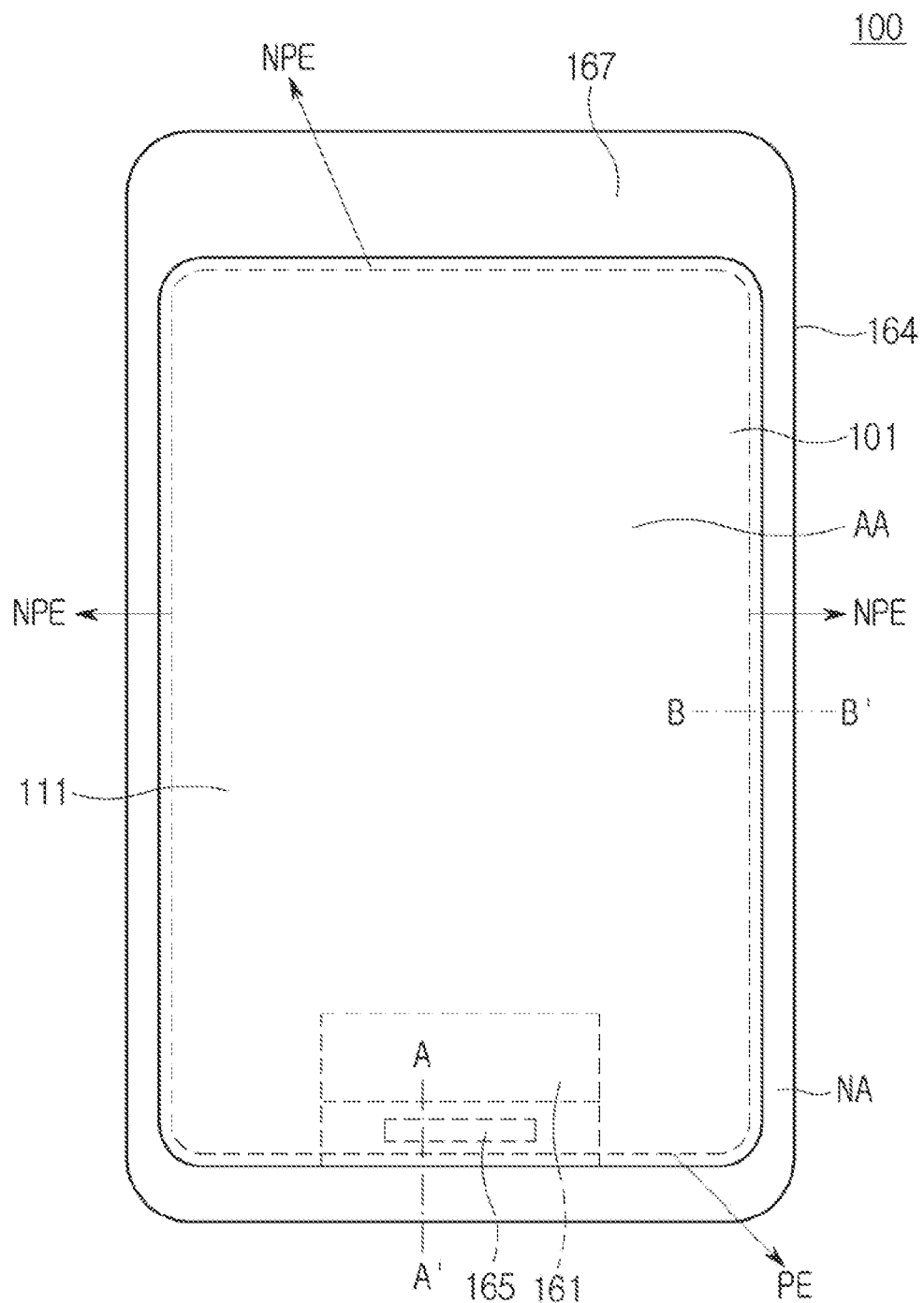
FIG. 8 is a plan view that shows a bent flexible panel according to an embodiment of the present disclosure.

FIG. 8 is a plan view that shows a bent flexible panel according to an embodiment of the present disclosure.

Referring to FIGS. 6 to 8, the flexible substrate according to the present disclosure will be explained.

Particularly, referring to FIG. 6, the flexible substrate 111 can be divided into the active area (AA) and the non-active area (NA) surrounding edges of the active area (AA). In the non-active area (NA), the pad area (PA) in which the pads are disposed can be divided. In the active area (AA), a plurality of sub-pixels are disposed. The sub-pixels can be divided by gate lines and data lines that cross each other.

A circuit element 161 can be a configuration that is connected with the pads in the pad area (PA) of the flexible substrate 111. The circuit element 161 can include bumps or steps. The bumps of the circuit element 161 can be connected with the pads of the pad area (PA) through an anisotropic conductive film. The circuit element 161 can be a Chip on Film (COF) in which a driver IC is mounted in a flexible film. In addition, the circuit element 161 can be bonded to the pads directly through Chip on Glass (COG) process. Also, the circuit element 161 can be a flexible circuit such as a Flexible Printed Circuit (FPC). The present disclosure will be described based on COF taken as an example of the circuit element 161.

As explained previously, out of four sides of the flexible substrate 111 or the panel layer 110, a side where the pad area (PA) in which pads are formed positions is defined as the pad edge (PE) and a side where the pads are not formed is defined as the peripheral edge (NPE). In other words, in an assumption that the flexible substrate 111 is a square shape, one side is the pad edge (PE), and the remaining three sides can be referred to as the peripheral edges (NPE). In a plan view illustrated in FIG. 8, the lower side of the flexible substrate 111 at which the driver IC 165 and the circuit element 161 are bent is the pad edge (PE) and the remaining three sides (the left, the right and the upper side) can be the peripheral edges (NPE). The cutting line A-A' is the one that cuts the pad edge (PE), and the cutting line B-B' is the one that cuts the peripheral edge (NPE).

Here, A-A' section and B-B' section of the display panel 100 according to the present disclosure will be explained in detail with reference to FIGS. 9 to 14.

Referring to FIG. 7, the flexible substrate 111 can be bent in a rear direction so that a side contacting with the pad area (PA) can have a predefined curvature. As the flexible substrate 111 gets bent, the pad area (PA) can overlap with the active area (AA) in a rear direction of the active area (AA). From the front of the display panel 100, the circuit element 161 or the driver IC 165 may not be made visible. For bending, the flexible substrate 111 can be formed of a flexible material. For example, the flexible substrate 111 can be formed of a plastic material such as polyimide.

Referring to FIG. 8, on a surface of the bent flexible substrate 111, the cover window 164 can be coupled. The cover window 164 is formed to be larger than the bent flexible substrate 111 so that the cover window 164 can accommodate the flexible substrate 111 in its inside.

Also, on another surface of the bent flexible substrate 111, a backplate 101 can be coupled. The backplate 101 can serve to maintain rigidity of the display panel 100, prevent foreign substances from attaching to the bottom portion of the display panel 100 and absorb external shocks. The backplate 101 can be implemented as a plastic thin film made of polyimide. Forming the backplate 101 not in the bending area (BA) can be appropriate. As to be described later on, the backplate 101 can include a first backplate 101*a* and a second backplate 101*b*. The backplate will be explained in more detail later on.

Figure 9:
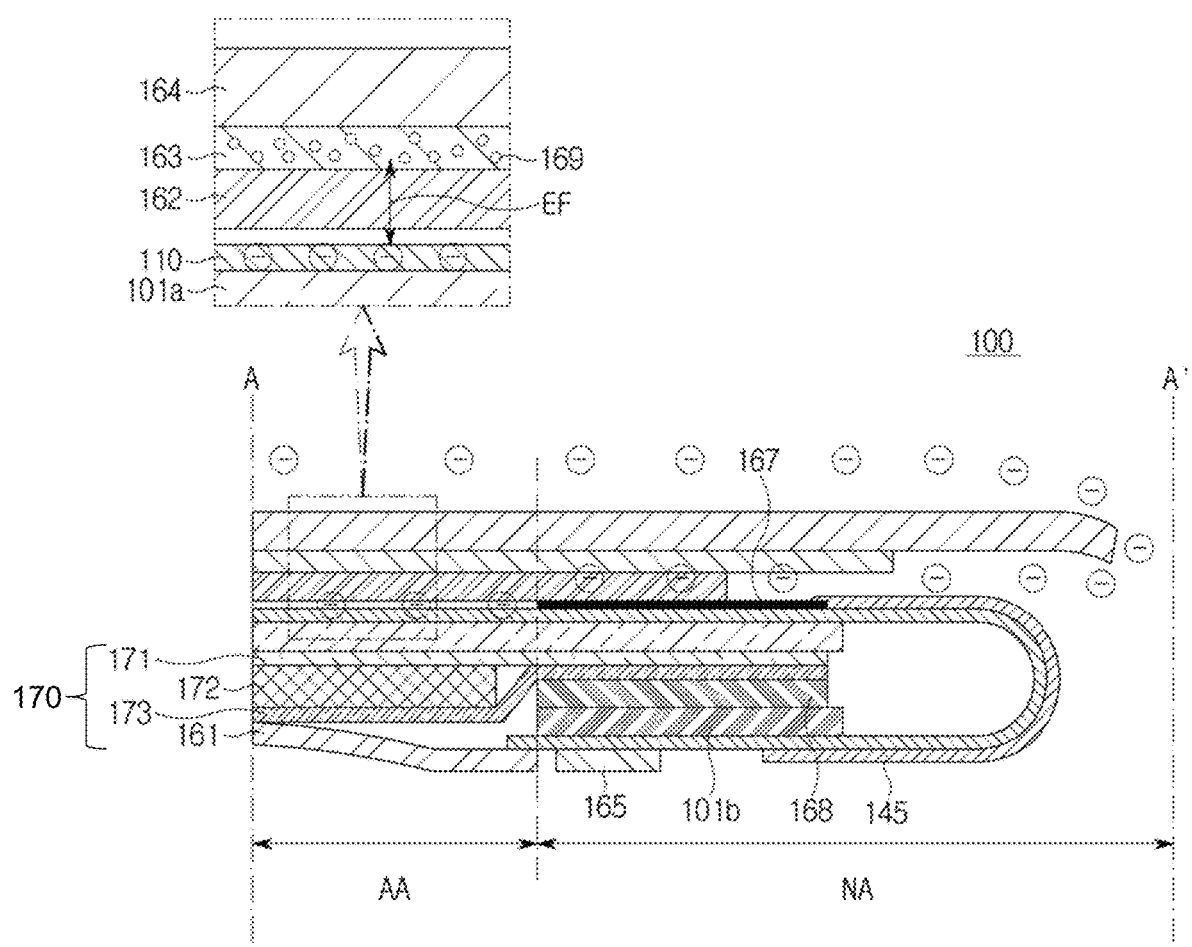
FIG. 9 shows a section taken in A-A' direction of the display panel of FIG. 8 according to an embodiment of the present disclosure.

FIG. 9 shows a section taken in A-A' direction of the display panel of FIG. 8 according to an embodiment of the present disclosure.

Figure 10:
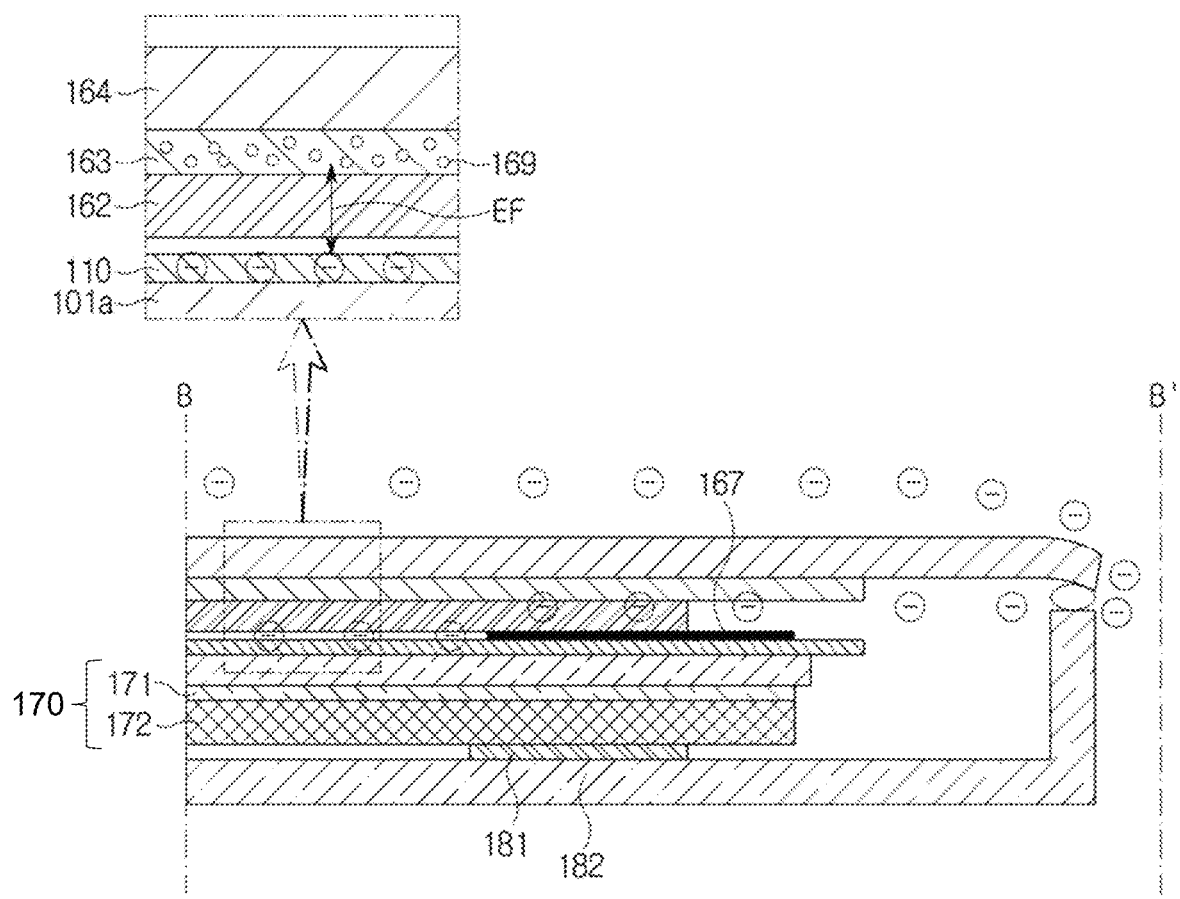
FIG. 10 shows a section taken in B-B' direction of the display panel in FIG. 8 according to an embodiment of the present disclosure.

FIG. 10 shows a section taken in B-B' direction of the display panel in FIG. 8 according to an embodiment of the present disclosure.

By referring to FIGS. 9 and 10, the display panel 100 according to an embodiment of the present disclosure will be explained below. Here, FIG. 9 shows a section (A-A') of the pad edge (PE) contacted by the pad area where the pad is formed in the display panel 100.

Referring to FIG. 9, the display panel 100 can include the cover window 164 which is the uppermost layer, the adhesive layer 163 disposed below the cover window 164, the polarizer 162 disposed below the adhesive layer 163 and the panel layer 110 disposed below the polarizer 162. As described by referring to FIG. 4, the panel layer 110 can include the flexible substrate and can be bent in the bending area. FIG. 7 illustrates bending of a bent panel layer 110 which includes the flexible substrate.

The cover window 164 is disposed on an uppermost layer of the display panel 100 and can be formed of glass or plastic. The cover window 164 serves as a protection layer protecting internal elements of the display panel 100 and is exposed outside. Therefore, the cover window 164 is contacted with a finger of a user when a user of the display device touches it and then an electric charge can occur due to friction thereon. The electric charge occurred by friction and the like can transfer along a side of the cover window 164 and penetrate into the inside of the display panel 100.

The adhesive layer 163 is disposed below the cover window 164 and serves to adhere the cover window 164 to the polarizer 162. The adhesive layer 163, for example, can be an Optical Clear Adhesive (OCA) or a Pressure Sensitive Adhesive (PSA) and can be of a transparent material.

According to the embodiment, the adhesive layer 163 can be a layer at which the permittivity reduction processing is applied. Specifically, the permittivity of the adhesive layer 163 can be lower than that of the cover window 164. For example, if the cover window 164 is formed of a glass material, the permittivity of glass is 5 to 6 in general. For another example, if the cover window 164 is formed of a plastic material, the permittivity of plastic is 3 in general. For example, the permittivity of the adhesive layer 163 according to the present disclosure can be 2.6.

In order to reduce the permittivity of the adhesive layer 163, the adhesive layer 163 can include a filler 169 having a low permittivity. For example, the low permittivity filler can be formed of a material of polymer series. For example, the low permittivity filler can be formed of polypropylene (PP) or polyethylene (PE). For example, the low permittivity filler can be formed of a fluoride material. For example, the low permittivity filler can be formed of a Teflon-based material.

For another example, the adhesive layer 163 can be formed of a material with a low permittivity. For example, the adhesive layer 163 can be formed of polypropylene (PP) or polyethylene (PE) which are materials of polymer series. Further, the adhesive layer 163 can be formed of Teflon, a fluoride material.

According to the embodiment, as the adhesive layer 163 is applied with the permittivity reduction processing, the Greenish phenomenon can be prevented. As explained above, the Greenish phenomenon is attributable to a shift phenomenon in the transistor inside the panel layer 110, which occurs when an electric charge from the outside penetrates into the inside of the panel layer 110 and piles up there.

Accordingly, the related art focused on preventing penetration of the electric charge from the outside into the inside of the panel layer 110. For example, the related art used a method of forming a travel path for an electric charge to be transferred along an antistatic solution film to the heat dissipation sheet 173 disposed below by applying an antistatic solution to the outer surface of the panel layer 110 and curing the applied solution.

However, the present disclosure can allow the electric charge transferring to the panel layer 110, without forming the travel path for the electric charge by applying the antistatic solution. The electric charge piled up in the panel layer 110 forms an electric field (EF) with the conventional adhesive layer 163 or the cover window 164 having a high permittivity. The shift phenomenon inside the panel layer 110 takes place since the transistor is located within such electric field (EF). Since the present embodiment applies the permittivity reduction processing on the adhesive layer 163, an electric field (EF) having a relatively low intensity is formed between the electric charge inside the panel layer 110 and the adhesive layer 163, compared with the conventional intensity of an electric field therebetween, and therefore the shift phenomenon in the transistor and the consequent Greenish phenomenon can be prevented despite accumulation of the electric charge in the inside of the panel layer 110. Moreover, the inventors of the present disclosure experimentally invented the method to dramatically reduce the Greenish phenomenon by forming the permittivity of the adhesive layer 163 to be about 2.6.

In addition, according to the related art, it was difficult to apply the antistatic solution at the pad edge (PE) of the display panel 100. Specifically, with reference to FIG. 9, since the panel layer 110 is formed in a bendable structure at the pad edge (PE), it was difficult to apply the antistatic solution to sides of the adhesive layer 163 and the polarizer 162. On the other hand, the present disclosure applies the permittivity reduction processing over the adhesive layer 163, the Greenish phenomenon can be prevented without such difficulty.

The polarizer 162 can be formed of a film having a feature of polarization. The polarizer 162 can suppress reflection of external light and reduce luminous reflectance when viewed in the outside. The polarizer 162 can be disposed in the active area (AA).

A first backplate 101a is a firm structure formed below the panel layer 110 and can serve to reinforce rigidity of the panel layer 110. The first backplate 101a can be formed of a plastic thin film.

A support member 170 can be configured as a three-layer consisting of the adhesive 171, a cushion tape (cushion plate) 172 and the heat dissipation sheet 173. The adhesive 171 can be formed on a rear surface of the first backplate 101a. The adhesive 171 can include an embossed pattern. The embossed pattern can prevent bubbling. The cushion tape 172 can serve to absorb a shock when an external shock is given thereto. The cushion tape 172 can be formed on a rear surface of the adhesive 171. The heat dissipation sheet 173 can be disposed below the cushion tape 172. The heat dissipation sheet 173 can serve to dissipate heat. The heat dissipation sheet 173 can be formed of, for example, a metal material such as copper in order to dissipate heat being generated in the driver IC 165 or the circuit element 161. Also, the heat dissipation sheet 173 can serve as a ground that discharges the electric charge transferred along the travel path formed by the antistatic solution according to the related art.

A black matrix 167 can be formed in some areas on the panel layer 110. The black matrix 167 can be formed along edges of the panel layer 110. The black matrix 167 can be formed of a black ink.

A micro-coating layer 145 can be disposed on the outer surface of the panel layer 110 in the bending area (BA). The micro-coating layer 145 can serve to protect wirings that extend from the pad disposed in the pad area (PA). The micro-coating layer 145 can be formed of acrylic materials such as an acrylate polymer.

The adhesive tape 168 can be disposed between the heat dissipation sheet 173 and the second backplate 101b. The adhesive tape 168 can serve to reduce a curvature of the bending area (BA) by having a uniform thickness. Further, the adhesive tape 168 can serve to absorb a shock by an external force since the adhesive tape 168 can increase a thickness of the cushion tape 172.

A second backplate 101b is a firm structure disposed below the heat dissipation sheet 173 and can serve to reinforce rigidity of the panel layer 110 at an end of the bending area (BA).

The driver IC 165 and the circuit element 161 can be connected with each other. The circuit element 161 can be a Flexible Printed Circuit Board (FPCB). The driver IC 165 can be an IC such as a data driver, a timing controller and the like.

Meanwhile, unlike description below with reference to FIG. 10, it is preferable that the heat dissipation sheet 173 not be omitted in the pad edge (PE) where the pad area (PA) is in contact with. In other words, below the panel layer 110, the adhesive 171, the cushion tape 172 and the heat dissipation sheet 173 can be sequentially disposed. At the pad edge (PE), since the driver IC 165 and the circuit element 161 are disposed below, it is preferable to dispose the heat dissipation sheet 173 to dissipate heat generated in the driver IC 165 and the circuit element 161 to the outside.

With reference to FIG. 10, FIG. 10 shows a section (B-B') of the peripheral edge (NPE) of the area in the flexible substrate 111 where the pad is not formed. In explaining FIG. 10, description of the components referred with the same reference numeral are replaced by the aforementioned description.

By referring to FIG. 10, the display panel 100 can include the cover window 164 which is the uppermost layer, the adhesive layer 163 disposed below the cover window 164, the polarizer 162 disposed below the adhesive layer 163, and the panel layer 110 disposed below the polarizer 162. The panel layer 110 can include the flexible substrate, as explained above with reference to FIG. 4.

The cover window 164 is disposed on an uppermost surface of the display panel 100 and can be formed of glass or plastic. On the cover window 164, an electric charge is generated by friction, and the electric charge can transfer along a side of the cover window 164 and penetrate into the inside of the display panel 100.

The adhesive layer 163 is an adhesive layer disposed below the cover window 164 and can be an Optical Clear Adhesive (OCA) or a Pressure Sensitive Adhesive (PSA) which are transparent materials.

The adhesive layer 163 can be the layer in which the permittivity reduction processing is applied as explained previously with reference to FIG. 9. For example, the permittivity of the adhesive layer 163 can be lower than that of the cover window 164, and for example, the permittivity of the adhesive layer 163 can be 2.6 or less.

In order to apply the permittivity reduction processing on the adhesive layer 163, the adhesive layer 163 can include a filler 169 having a low permittivity. Or, the adhesive layer 163 can be formed of a material having a low permittivity.

According to the embodiment, since the adhesive layer 163 is applied with the permittivity reduction processing, the Greenish phenomenon can be prevented. As explained above, the Greenish phenomenon is attributable to a shift phenomenon in the transistor inside the panel layer 110, which occurs when an electric charge from the outside penetrates into the inside of the panel layer 110 and piles up there.

Accordingly, the related art focused on preventing penetration of the electric charge from the outside into the inside of the panel layer 110. For example, the related art used a method of forming a travel path for an electric charge to be transferred along an antistatic solution film to the heat dissipation sheet 173 disposed below by applying an antistatic solution to the outer surface of the panel layer 110 and curing the applied solution.

However, the present disclosure can allow the electric charge transferring to the panel layer 110, without forming the travel path for the electric charge by applying the antistatic solution. The electric charge piled up in the panel layer 110 forms an electric field (EF) with the conventional adhesive layer 163 or the cover window 164 having a high permittivity. The shift phenomenon inside the panel layer 110 takes place since the transistor is located within such electric field (EF).

Since the present embodiment applies the permittivity reduction processing on the adhesive layer 163, an electric field (EF) having a relatively low intensity is formed between the electric charge inside the panel layer 110 and the adhesive layer 163, compared with the conventional intensity of an electric field therebetween, and therefore the shift phenomenon in the transistor and the consequent Greenish phenomenon can be prevented despite accumulation of the electric charge in the inside of the panel layer 110. Moreover, the inventors of the present disclosure experimentally invented the method to dramatically reduce the Greenish phenomenon by forming the permittivity of the adhesive layer 163 to be about 2.6.

Further, according to the embodiment, in the peripheral edge (NPE), the adhesive 171 and the cushion tape 172 can be sequentially disposed below the panel layer 110. In other words, according to the embodiment, the heat dissipation sheet 173 can be omitted in the peripheral edge (NPE).

According to the related art, an electric charge transfers along the antistatic solution and the like to the heat dissipation sheet 173 and is discharged through the heat dissipation sheet 173. However, in the present embodiment, the electric charge is allowed to penetrate into the inside of the panel layer 110, and by means of a permittivity reduction processing on the adhesive layer 163, the shift phenomenon and the Greenish phenomenon can be prevented as the intensity of the electric field is being lowered by the permittivity reduction processing. Therefore, the heat dissipation sheet 173 adopted by the related art can be removed from the peripheral edge (NPE). By doing so, it becomes possible to decrease manufacturing cost of the display panel 100, make the display panel 100 thinner, and reduce weight thereof.

Therefore, according to the embodiment, the cushion tape 172 can be directly attached to a middle frame 182 in the peripheral edge (NPE). In other words, since the heat dissipation sheet 173 is omitted, while it used to be disposed below the cushion tape 172 by the related art or as in FIG. 9, the cushion tape 172 can be attached directly to the middle frame 182 that is disposed below the cushion tape 172. In order to enhance a fixation force, a fixing tape 181 can be added between the cushion tape 172 and the middle frame 182, however, such addition also can be understood as a direct attachment of the cushion tape 172 to the middle frame 182.

The polarizer 162 can be formed of a film having a feature of polarization and can suppress reflection of external light.

The panel layer 110 can include a switching element such as a driving transistor in its inside.

The first backplate 101a is a firm structure disposed below the panel layer 110 and can serve to reinforce rigidity of the panel layer 110.

The support member 170 can include the adhesive 171 and the cushion tape 172. In addition, as explained above, the support member 170 may not include the heat dissipation sheet 173. In other words, the support member 170 can be directly attached to the middle frame 182.

The middle frame 182 is a set frame defining the outer appearance of the display panel 100. For example, the middle frame 182 can define the outer appearance of the display panel 100, since it is coupled to the cover window 164 below the cover window 164. In addition, the middle frame 182 can define the lower outer appearance of the display panel 100 as the middle frame 182 is formed to cover the lower portion of the display panel 100.

Figure 11:
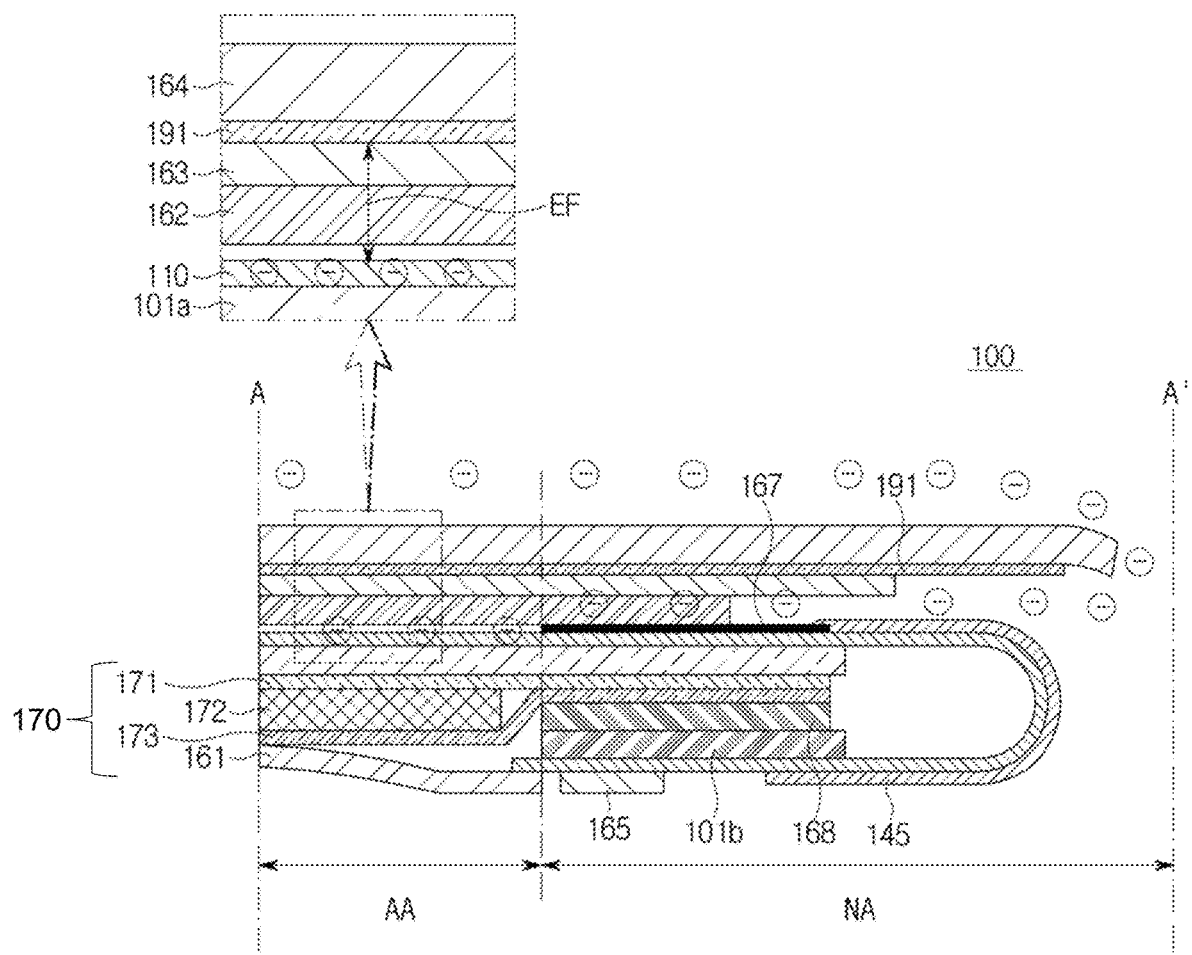
FIG. 11 shows a section taken in A-A' direction of the display panel in FIG. 8 according to another embodiment of the present disclosure.

FIG. 11 shows a section taken in A-A' direction of the display panel in FIG. 8 according to another embodiment of the present disclosure.

Figure 12:
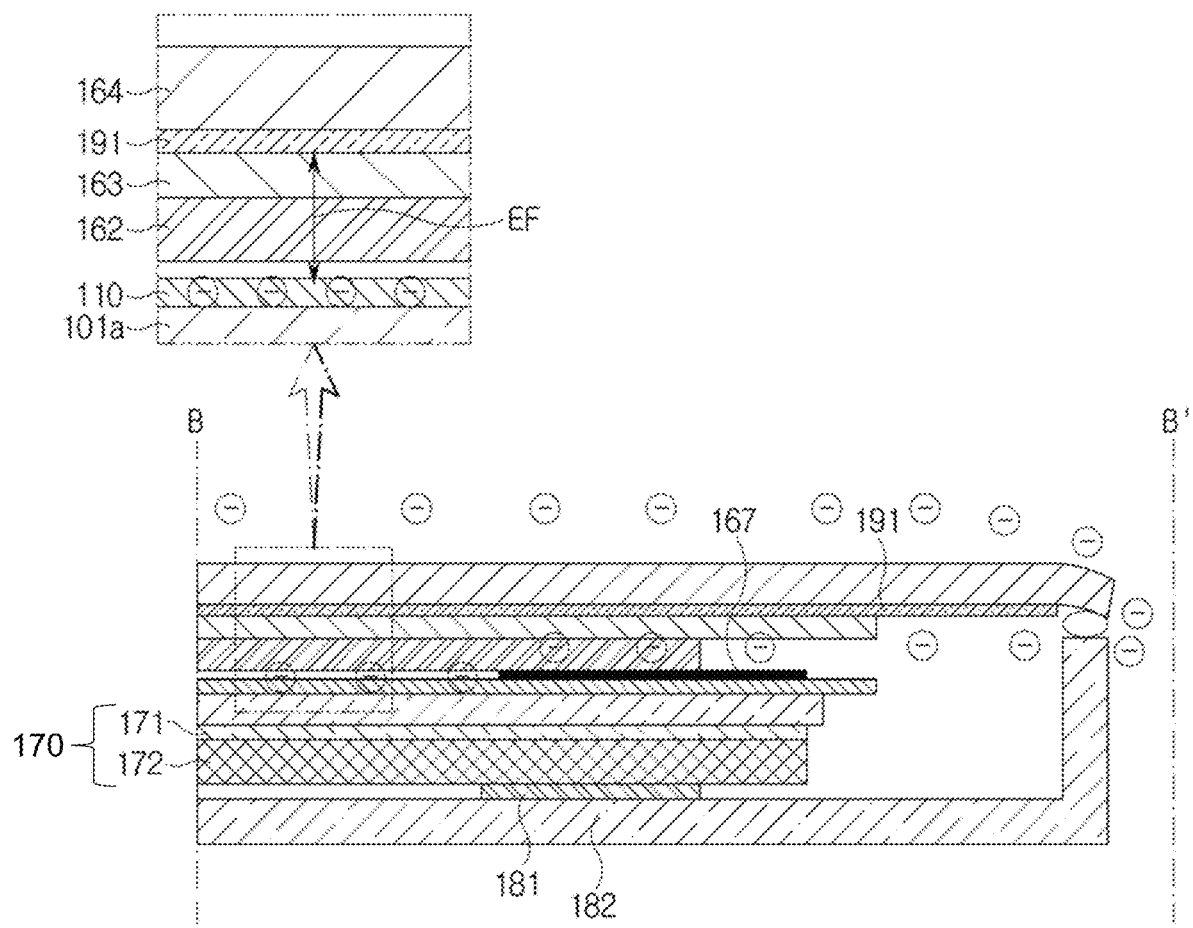
FIG. 12 shows a section taken in B-B' direction of the display panel in FIG. 8 according to another embodiment of the present disclosure.

FIG. 12 shows a section taken in B-B' direction of the display panel in FIG. 8 according to another embodiment of the present disclosure.

By referring to FIGS. 11 and 12, the display panel 100 according to another embodiment of the present disclosure will be explained. Description of components designated by identical reference numerals are omitted.

According to the embodiment, the cover window 164 is applied with the permittivity reduction processing. For example, in order to apply the permittivity reduction processing, a low permittivity coating layer 191 can be additionally disposed below the cover window 164.

Specifically, the cover window 164 can be coated with a material having a low permittivity through a coating below. The low permittivity coating layer 191 can be, for example, a film layer formed of polypropylene (PP) or polyethylene (PE) which are materials of polymer series. Or, the low permittivity coating layer 191 can be a film layer formed of a Teflon material which is a fluoride material.

According to the embodiment, the permittivity reduction processing is applied on the cover window 164, and thus, the Greenish phenomenon can be prevented. As explained above, the Greenish phenomenon is attributable to a shift phenomenon in the transistor inside the panel layer 110, which occurs when an electric charge from the outside penetrates into the inside of the panel layer 110 and piles up there.

Accordingly, the related art focused on preventing penetration of the electric charge from the outside into the inside of the panel layer 110. For example, the related art used a method of forming a travel path for an electric charge to be transferred along an antistatic solution film to the heat dissipation sheet 173 disposed below by applying an antistatic solution to the outer surface of the panel layer 110 and curing the applied solution.

However, the present disclosure can allow the electric charge transferring to the panel layer 110, without forming the travel path for the electric charge by applying the antistatic solution. The electric charge piled up in the panel layer 110 forms an electric field (EF) with the conventional cover window 164 having a high permittivity. If the cover window 164 is formed of a glass material, the permittivity is 5 to 6 and if the cover window is formed of a plastic material, the permittivity is 3 in general. The low permittivity coating layer 191 formed below the cover window 164 according to the embodiment can have a permittivity of 2.6 or less. The shift phenomenon inside the panel layer 110 takes place since the transistor is located within such electric field (EF). Since the present embodiment applies the permittivity reduction processing on the cover window 164, an electric field (EF) having a relatively low intensity is formed between the electric charge inside the panel layer 110 and the cover window 164, compared with the conventional intensity of an electric field therebetween, and therefore the shift phenomenon in the transistor and the consequent Greenish phenomenon can be prevented despite accumulation of the electric charge in the inside of the panel layer 110. Moreover, the inventors of the present disclosure experimentally invented the method to dramatically reduce the Greenish phenomenon by forming the permittivity of the cover window 164 to be about 2.6.

In addition, according to the related art, it was difficult to apply the antistatic solution at the pad edge (PE) of the display panel 100. Specifically, with reference to FIG. 11, since the panel layer 110 is formed in a bendable structure at the pad edge (PE), it was difficult to apply the antistatic solution to sides of the adhesive layer 163 and the polarizer 162. On the other hand, the present disclosure applies the permittivity reduction processing on the cover window 164, the Greenish phenomenon can be prevented without such difficulty.

Referring to FIG. 12, FIG. 12 shows a section (B-B') of the peripheral edge (NPE) of the area in the flexible substrate 111 where the pad is not formed.

Referring to FIG. 12, the display panel 100 can include the cover window 164 which is the uppermost layer, the low permittivity coating layer 191 disposed below the cover window 164, the adhesive layer 163 disposed below the low permittivity coating layer 191, the polarizer 162 disposed below the adhesive layer 163, and the panel layer 110 disposed below the polarizer 162. The panel layer 110 can include the flexible substrate, as explained above with reference to FIG. 4.

As explained above with reference to FIG. 11, the cover window 164 in the present embodiment can be the cover window 164 to which the permittivity reduction processing is applied. For example, the cover window 164 can include the low permittivity coating layer 191 below. For example, the coating layer 191 below the cover window 164 can be a film layer formed of polypropylene (PP) or polyethylene (PE) which are materials of polymer series Or, the low permittivity coating layer 191 can be a film layer formed of a Teflon material which is a fluoride material.

According to the embodiment, the permittivity reduction processing is applied on the cover window 164, and thus, the Greenish phenomenon can be prevented. As explained above, the Greenish phenomenon is attributable to a shift phenomenon in the transistor inside the panel layer 110, which occurs when an electric charge from the outside penetrates into the inside of the panel layer 110 and piles up there.

Accordingly, the related art focused on preventing penetration of the electric charge from the outside into the inside of the panel layer 110. For example, the related art used a method of forming a travel path for an electric charge to be transferred along an antistatic solution film to the heat dissipation sheet 173 disposed below by applying an antistatic solution to the outer surface of the panel layer 110 and curing the applied solution.

However, the present disclosure can allow the electric charge transferring to the panel layer 110, without forming the travel path for the electric charge by applying the antistatic solution. The electric charge piled up in the panel layer 110 forms an electric field (EF) with the conventional cover window 164 having a high permittivity. If the cover window 164 is formed of a glass material, the permittivity is 5 to 6 and if the cover window is formed of a plastic material, the permittivity is 3 in general. The coating layer 191 formed below the cover window 164 according to the embodiment can have permittivity of 2.6 or less. The shift phenomenon inside the panel layer 110 takes place since the transistor is located within such electric field (EF). Since the present embodiment applies the permittivity reduction processing on the cover window 164, an electric field (EF) having a relatively low intensity is formed between the electric charge inside the panel layer 110 and the cover window 164, compared with the conventional intensity of an electric field therebetween, and therefore the shift phenomenon in the transistor and the consequent Greenish phenomenon can be prevented despite accumulation of the electric charge in the inside of the panel layer 110. Moreover, the inventors of the present disclosure experimentally invented the method to dramatically reduce the Greenish phenomenon by forming the permittivity of the cover window 164 to be about 2.6.

Further, according to the embodiment, in the peripheral edge (NPE), the adhesive 171 and the cushion tape 172 can be sequentially disposed below the panel layer 110. In other words, according to the embodiment, the heat dissipation sheet 173 can be omitted in the peripheral edge (NPE).

According to the related art, an electric charge transfers along the antistatic solution and the like to the heat dissipation sheet 173 and is discharged through the heat dissipation sheet 173. However, in the present embodiment, the electric charge is allowed to penetrate into the inside of the panel layer 110, and by means of a permittivity reduction processing on the cover window 164, the shift phenomenon and the Greenish phenomenon can be prevented as the intensity of the electric field is being lowered by the permittivity reduction processing. Therefore, the heat dissipation sheet 173 adopted by the related art can be removed from the peripheral edge (NPE). By doing so, it becomes possible to decrease manufacturing cost of the display panel 100, make the display panel 100 thinner, and reduce weight thereof. Therefore, according to the embodiment, the cushion tape 172 can be directly attached to a middle frame 182 in the peripheral edge (NPE). In other words, since the heat dissipation sheet 173 is omitted, while it used to be disposed below the cushion tape 172 by the related art or as in FIG. 11, the cushion tape 172 can be attached directly to the middle frame 182 that is disposed below the cushion tape 172. In order to enhance a fixation force, a fixing tape 181 can be added between the cushion tape 172 and the middle frame 182, however, such addition also can be understood as a direct attachment of the cushion tape 172 to the middle frame 182.

The polarizer 162 can be formed of a film having a feature of polarization and can suppress reflection of external light.

The panel layer 110 can include a switching element such as a driving transistor in its inside.

The first backplate 101a is a firm structure disposed below the panel layer 110 and can serve to reinforce rigidity of the panel layer 110.

The support member 170 can include the adhesive 171 and the cushion tape 172.

In addition, as explained above, the support member 170 may not include the heat dissipation sheet 173. In other words, the support member 170 can be directly attached to the middle frame 182.

The middle frame 182 is a set frame defining the outer appearance of the display panel 100. For example, the middle frame 182 can define the outer appearance of the display panel 100, since it is coupled to the cover window 164 below the cover window 164. In addition, the middle frame 182 can define the lower outer appearance of the display panel 100 as the middle frame 182 is formed to cover the lower portion of the display panel 100.

Figure 13:
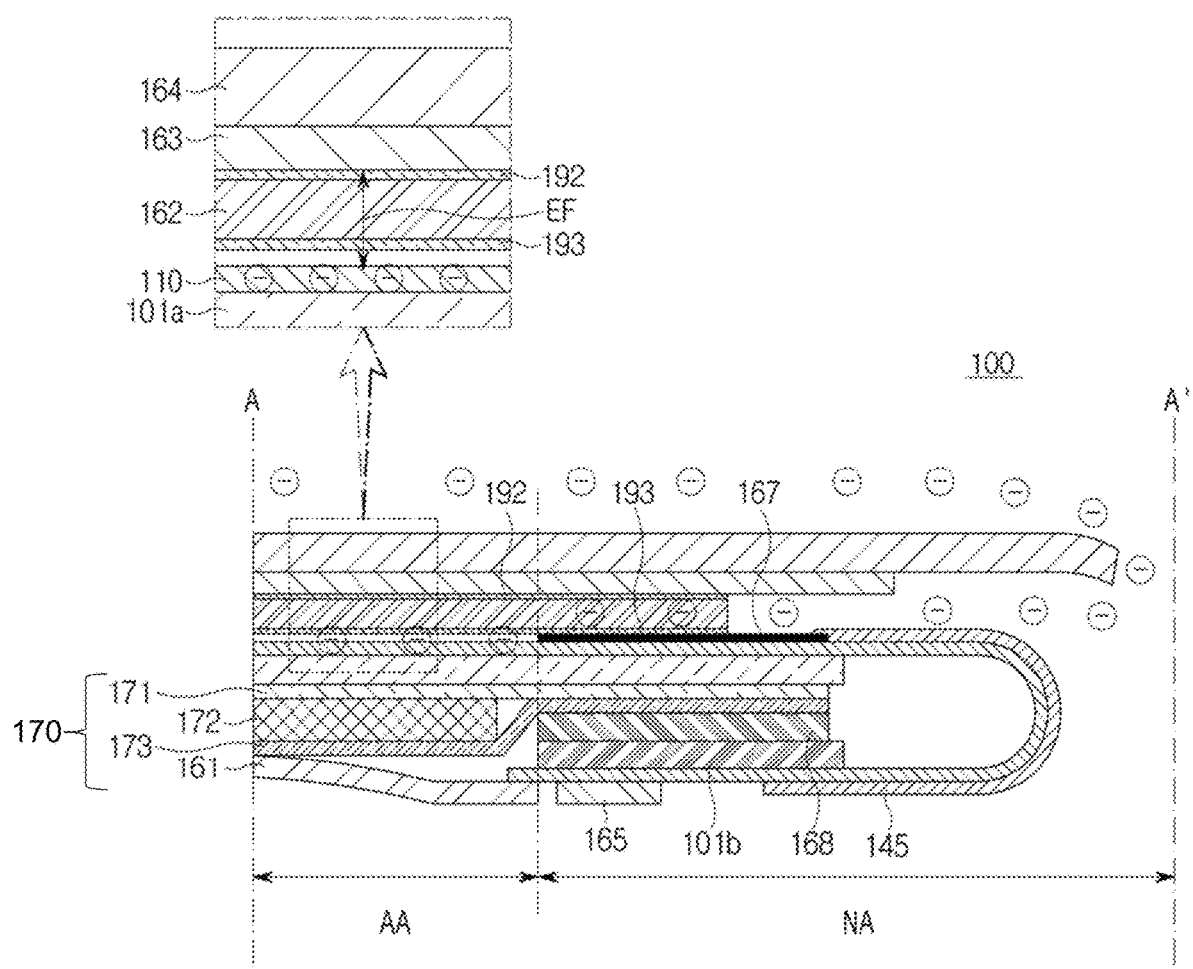
FIG. 13 shows a section taken in A-A' direction of the display panel in FIG. 8 according to still another embodiment of the present disclosure.

FIG. 13 shows a section taken in A-A' direction of the display panel in FIG. 8 according to still another embodiment of the present disclosure.

Figure 14:
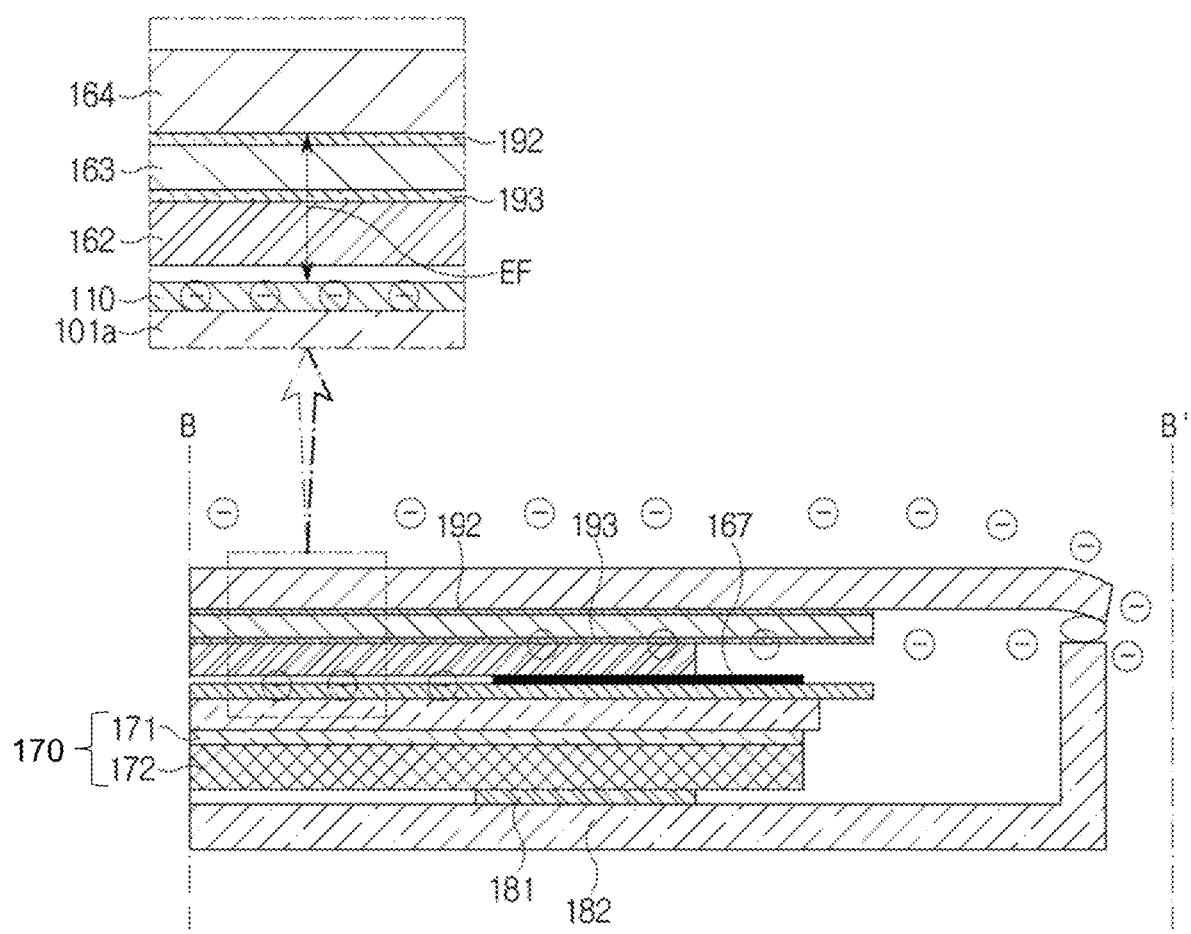
FIG. 14 shows a section taken in B-B' direction of the display panel in FIG. 8 according to still another embodiment of the present disclosure.

FIG. 14 shows a section taken in B-B' direction of the display panel in FIG. 8 according to still another embodiment of the present disclosure.

Referring to FIGS. 13 and 14, the display panel 100 according to another embodiment of the present disclosure will be explained. Description of components designated by identical reference numerals are omitted.

According to the present embodiment, the polarizer 162 is applied with the permittivity reduction processing. For example, in order to apply the permittivity reduction processing, the low permittivity coating layers 192 and 193 each can be disposed additionally on and below the polarizer 162 respectively. As another example, on the polarizer 162, the low permittivity coating layer 192 can be disposed additionally. For still another example, below the polarizer 162, the low permittivity coating layer 193 can be disposed additionally. For convenience of description, the present disclosure takes an example where the low permittivity coating layers 192 and 193 is disposed on the polarizer 162 and below the polarizer 162 respectively.

Specifically, the low permittivity material can be coated on a top surface and rear surface of the polarizer 162. The low permittivity coating layers 192 and 193 can be, for example, formed of polypropylene (PP) or polyethylene (PE) which are materials of polymer series. Or, the low permittivity coating layers 192 and 193 can be film layers formed of Teflon, a fluoride material.

According to the embodiment, the permittivity reduction processing is applied on the polarizer 162, and thus, the Greenish phenomenon can be prevented. As explained above, the Greenish phenomenon is attributable to a shift phenomenon in the transistor inside the panel layer 110, which occurs when an electric charge from the outside penetrates into the inside of the panel layer 110 and piles up there.

Accordingly, the related art focused on preventing penetration of the electric charge from the outside into the inside of the panel layer 110. For example, the related art used a method of forming a travel path for an electric charge to be transferred along an antistatic solution film to the heat dissipation sheet 173 disposed below by applying an antistatic solution to the outer surface of the panel layer 110 and curing the applied solution.

However, the present disclosure can allow the electric charge transferring to the panel layer 110, without forming the travel path for the electric charge by applying the antistatic solution. The electric charge piled up in the panel layer 110 forms an electric field (EF) with the conventional cover window 164 having a high permittivity. If the cover window 164 is formed of a glass material, the permittivity is 5 to 6 and if the cover window is formed of a plastic material, the permittivity is 3 in general. The low permittivity coating layers 192 and 193 formed on and below the polarizer 162 according to the embodiment can have permittivity of 2.6 or less. The shift phenomenon inside the panel layer 110 takes place since the transistor is located within such electric field (EF). Since the present embodiment applies the permittivity reduction processing on the polarizer 162, an electric field (EF) having a relatively low intensity is formed between the electric charge inside the panel layer 110 and the polarizer 162, compared with the conventional intensity of an electric field therebetween, and therefore the shift phenomenon in the transistor and the consequent Greenish phenomenon can be prevented despite accumulation of the electric charge in the inside of the panel layer 110. Moreover, the inventors of the present disclosure experimentally invented the method to dramatically reduce the Greenish phenomenon by forming the permittivity of the polarizer 162 to be about 2.6.

In addition, according to the related art, it was difficult to apply the antistatic solution at the pad edge (PE) of the display panel 100. Specifically, with reference to FIG. 11, since the panel layer 110 is formed in a bendable structure at the pad edge (PE), it was difficult to apply the antistatic solution to sides of the adhesive layer 163 and the polarizer 162.

On the other hand, the present disclosure applies the permittivity reduction processing on the polarizer 162, the Greenish phenomenon can be prevented without such difficulty.

Referring to FIG. 14, FIG. 14 shows a section (B-B') of the peripheral edge (NPE) of the area in the flexible substrate 111 where the pad is not formed.

Referring to FIG. 14, the display panel 100 can include the cover window 164 which is the uppermost layer, the adhesive layer 163 disposed below the cover window 164, the polarizer 162 disposed below the adhesive layer 163 and includes the low permittivity coating layers 192 and 193 on its top surface and/or rear surface and the panel layer 110 disposed below the polarizer 162. The panel layer 110 can include the flexible substrate, as explained above with reference to FIG. 4.

As explained above with reference to FIG. 13, the polarizer 162 in the present embodiment can be the polarizer 162 on (onto) which the permittivity reduction processing is applied. For example, the polarizer 162 can include the low permittivity coating layers 192 and 193 on its top surface and/or rear surface. The low permittivity coating layers 192 and 193 can be, for example, film layers formed of polypropylene (PP) or polyethylene (PE) which are materials of polymer series. Or, the low permittivity coating layers 192 and 193 can be film layers formed of Teflon, a fluoride material.

According to the embodiment, the permittivity reduction processing is applied on the polarizer 162, and thus, the Greenish phenomenon can be prevented. As explained above, the Greenish phenomenon is attributable to a shift phenomenon in the transistor inside the panel layer 110, which occurs when an electric charge from the outside penetrates into the inside of the panel layer 110 and piles up there.

Accordingly, the related art focused on preventing penetration of the electric charge from the outside into the inside of the panel layer 110. For example, the related art used a method of forming a travel path for an electric charge to be transferred along an antistatic solution film to the heat dissipation sheet 173 disposed below by applying an antistatic solution to the outer surface of the panel layer 110 and curing the applied solution.

However, the present disclosure can allow the electric charge transferring to the panel layer 110, without forming the travel path for the electric charge by applying the antistatic solution. The electric charge piled up in the panel layer 110 forms an electric field (EF) with the conventional cover window 164 having a high permittivity. If the cover window 164 is formed of a glass material, the permittivity is 5 to 6 and if the cover window is formed of a plastic material, the permittivity is 3 in general. The low permittivity coating layers 192 and 193 formed on and below the polarizer 162 according to the embodiment can have permittivity of 2.6 or less. The shift phenomenon inside the panel layer 110 takes place since the transistor is located within such electric field (EF).

Since the present embodiment applies the permittivity reduction processing on the polarizer 162, an electric field (EF) having a relatively low intensity is formed between the electric charge inside the panel layer 110 and the polarizer 162, compared with the conventional intensity of an electric field therebetween, and therefore the shift phenomenon in the transistor and the consequent Greenish phenomenon can be prevented despite accumulation of the electric charge in the inside of the panel layer 110. Moreover, the inventors of the present disclosure experimentally invented the method to dramatically reduce the Greenish phenomenon by forming the permittivity of the polarizer 162 to be about 2.6.

Further, according to the embodiment, in the peripheral edge (NPE), the adhesive 171 and the cushion tape 172 can be sequentially disposed below the panel layer 110. In other words, according to the embodiment, the heat dissipation sheet 173 can be omitted in the peripheral edge (NPE).

According to the related art, an electric charge transfers along the antistatic solution and the like to the heat dissipation sheet 173 and is discharged through the heat dissipation sheet 173.

However, in the present embodiment, the electric charge is allowed to penetrate into the inside of the panel layer 110, and by means of a permittivity reduction processing on the polarizer 162, the shift phenomenon and the Greenish phenomenon can be prevented as the intensity of the electric field is being lowered by the permittivity reduction processing. Therefore, the heat dissipation sheet 173 adopted by the related art can be removed from the peripheral edge (NPE). By doing so, it becomes possible to decrease manufacturing cost of the display panel 100, make the display panel 100 thinner, and reduce weight thereof. Therefore, according to the embodiment, the cushion tape 172 can be directly attached to a middle frame 182 in the peripheral edge (NPE). In other words, since the heat dissipation sheet 173 is omitted, while it used to be disposed below the cushion tape 172 by the related art or as in FIG. 13, the cushion tape 172 can be attached directly to the middle frame 182 that is disposed below the cushion tape 172. In order to enhance a fixation force, a fixing tape 181 can be added between the cushion tape 172 and the middle frame 182, however, such addition also can be understood as a direct attachment of the cushion tape 172 to the middle frame 182.

The panel layer 110 can include a switching element such as a driving transistor in its inside.

The first backplate 101*a* is a firm structure disposed below the panel layer 110 and can serve to reinforce rigidity of the panel layer 110.

The support member 170 can include the adhesive 171 and the cushion tape 172. In addition, as explained above, the support member 170 may not include the heat dissipation sheet 173. In other words, the support member 170 can be directly attached to the middle frame 182.

The middle frame 182 is a set frame defining the outer appearance of the display panel 100. For example, the middle frame 182 can define the outer appearance of the display panel 100, since it is coupled to the cover window 164 below the cover window 164. In addition, the middle frame 182 can define the lower outer appearance of the display panel 100 as the middle frame 182 is formed to cover the lower portion of the display panel 100.

Those skilled in the art can understand that the present disclosure described herein can be implemented in other concrete forms without departing from the technical concept or essential features thereof. Thus, it should be understood that embodiments described hereinabove are examples in all aspects, and do not limit the present disclosure. The scope of the present disclosure will be denoted by the claims that are provided hereinbelow, rather than the detailed description. In addition, it should be construed that all modifications or variations that are derived from the meaning, scope and the concept of equivalence of the claims are covered in the scope of the present disclosure.

What is claimed is:

1. A display panel comprising:
a cover window;
an adhesive layer disposed below the cover window;
a polarizer disposed below the adhesive layer;
a panel layer disposed below the polarizer and including
an active area with pixels configured to emit light and
a non-active area corresponding to a bezel area surrounding edges of the active area, wherein one edge of the panel layer comprises a bent portion rearwardly bent such that the one edge of the panel layer partially overlaps with the active area;
a pad area including pads disposed in the non-active area at the one edge of the panel layer;
a first wiring in a first layer of the one edge of the panel layer and a second wiring in a second layer of the one edge of the panel layer, the first and second wirings electrically bending along the predefined curvature of the panel layer and connecting the pads to the panel layer for driving the pixels to emit light; and
a support member supporting the active area of the panel layer,
wherein at the one edge of the panel layer comprising the bent portion, the support member includes an adhesive, a cushion tape and a heat dissipation sheet sequentially disposed below the panel layer, and
wherein at other edges of the panel layer other than the one edge comprising the bent portion, the support member includes the adhesive and the cushion tape sequentially disposed below the panel layer.

2. The display panel of claim 1, wherein an electric field is formed with an electric charge penetrated from the cover window into the panel layer.

3. The display panel of claim 1, wherein a permittivity of the adhesive layer is lower than a permittivity of the cover window.

4. The display panel of claim 1, wherein the adhesive layer is formed of a material having a permittivity of about 2.6 or less.

5. The display panel of claim 1, wherein the adhesive layer comprises a low permittivity filler.

6. The display panel of claim 1, wherein the cover window further comprises a low permittivity coating layer disposed below the cover window.

7. The display panel of claim 1, further comprising:
a low permittivity coating layer disposed on the polarizer.

8. The display panel of claim 1, further comprising:
a low permittivity coating layer disposed below the polarizer.

9. A display panel comprising:
a cover window;
an adhesive layer disposed below the cover window;
a polarizer disposed below the adhesive layer;
a panel layer disposed below the polarizer; and
a pad area including pads,
wherein at a pad edge where the pad area is in contact with, the display panel further comprises:
a circuit element and a driver integrated circuit (IC) disposed below the panel layer; and
an adhesive, a cushion tape and a heat dissipation sheet sequentially disposed below the panel layer, and
wherein at least one among the cover window, the adhesive layer and the polarizer is applied with a permittivity reduction processing.

10. A display panel comprising:
a cover window;
an adhesive layer disposed below the cover window;
a polarizer disposed below the adhesive layer;
a panel layer disposed below the polarizer; and
a pad area including pads,
wherein at a peripheral edge where the pad area is not in contact with, the display panel further comprises an adhesive and a cushion tape sequentially disposed below the panel layer, wherein the cushion tape is directly attached to a middle frame, and wherein at least one among the cover window, the adhesive layer and the polarizer is applied with a permittivity reduction processing.

11. The display panel of claim 1, wherein the display panel further comprises a pad area including pads, and wherein at a peripheral edge where the pad area is not in contact with, no heat dissipation sheet is disposed below the panel layer.

12. The display panel of claim 1, wherein a micro-coating layer is disposed on an outer surface of the one edge of the panel layer to protect the first wirings and the second wirings.

13. The display panel of claim 1, wherein at the one edge of the panel layer comprising the bent portion, the heat dissipation sheet is disposed in the active area and the non-active area.

14. The display panel of claim 13, wherein at the one edge of the panel layer comprising the bent portion, the heat dissipation sheet in the non-active area is directly attached to the adhesive.

15. The display panel of claim 14, wherein at the one edge of the panel layer comprising the bent portion, the heat dissipation sheet in the active area is directly attached to the heat dissipation sheet.

16. The display panel of claim 15, wherein the heat dissipation sheet inclines at a predetermined angle in the active area to be directly connected to the adhesive in the non-active layer.

17. The display panel of claim 16, wherein a gap exists between the inclining heat dissipation sheet and the cushion tape.

* * * * *